United States Patent
Saito et al.

(10) Patent No.: US 8,901,743 B2
(45) Date of Patent: Dec. 2, 2014

(54) FABRICATION OF SEMICONDUCTOR DEVICE INCLUDING CHEMICAL MECHANICAL POLISHING

(71) Applicant: Fujitsu Semiconductor Limited, Yokohama-shi, Kanagawa (JP)

(72) Inventors: Tomiyasu Saito, Yokohama (JP);
Tatsuya Mise, Yokohama (JP);
Hiromichi Ichikawa, Yokohama (JP);
Tetsuya Takeuchi, Yokohama (JP);
Genshi Okuda, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 174 days.

(21) Appl. No.: 13/736,378

(22) Filed: Jan. 8, 2013

(65) Prior Publication Data

US 2013/0277859 A1    Oct. 24, 2013

(30) Foreign Application Priority Data

Apr. 24, 2012    (JP) .................. 2012-099259

(51) Int. Cl.
| | |
|---|---|
| *H01L 23/48* | (2006.01) |
| *H01L 23/52* | (2006.01) |
| *H01L 29/40* | (2006.01) |
| *H01L 21/768* | (2006.01) |
| *H01L 23/522* | (2006.01) |
| *H01L 23/532* | (2006.01) |

(52) U.S. Cl.
CPC ..... *H01L 21/76877* (2013.01); *H01L 23/53228* (2013.01); *H01L 21/7684* (2013.01); *H01L 23/53214* (2013.01); *H01L 23/5226* (2013.01)
USPC .................. 257/774; 257/E23.011; 257/775; 257/778; 438/612; 438/666

(58) Field of Classification Search
CPC ................. H01L 23/5226; H01L 2924/01078; H01L 2924/01079
USPC .................. 257/E21.527, E23.011, E31.127, 257/774–776, 778, 786; 438/108, 612, 614, 438/622, 629, 637–639, 666
See application file for complete search history.

(56) References Cited

U.S. PATENT DOCUMENTS

| | | | | |
|---|---|---|---|---|
| 6,325,977 | B1 * | 12/2001 | Theil ........................ | 422/82.05 |
| 6,756,679 | B2 * | 6/2004 | Noguchi et al. .............. | 257/762 |
| 6,861,670 | B1 * | 3/2005 | Ohtani et al. ................ | 257/66 |
| 7,642,711 | B2 * | 1/2010 | Araki ........................... | 313/506 |
| 7,760,973 | B2 * | 7/2010 | Numata ........................ | 385/31 |
| 7,767,570 | B2 * | 8/2010 | Chen et al. ................... | 438/597 |
| 8,212,364 | B2 * | 7/2012 | Yamazaki et al. ............ | 257/777 |
| 2002/0115295 | A1 * | 8/2002 | Kamikubo ................... | 438/692 |

FOREIGN PATENT DOCUMENTS

JP        2002-252194 A        9/2002

* cited by examiner

*Primary Examiner* — Chris Chu
(74) *Attorney, Agent, or Firm* — Westerman, Hattori, Daniels & Adrian, LLP

(57) ABSTRACT

A method of fabricating a semiconductor device includes forming a first insulation film over a semiconductor substrate, the semiconductor substrate including an outer region and an inner region located at an inner side of the outer region, forming a first wiring over the first insulation film in the inner region, forming a second insulation film over the first wiring and over the first insulation film, decreasing a film thickness of the second insulation film in the inner region with regard to a film thickness of the second insulation film in the outer region, and polishing the second insulation film after the decreasing of the film thickness of the second insulation film.

13 Claims, 27 Drawing Sheets

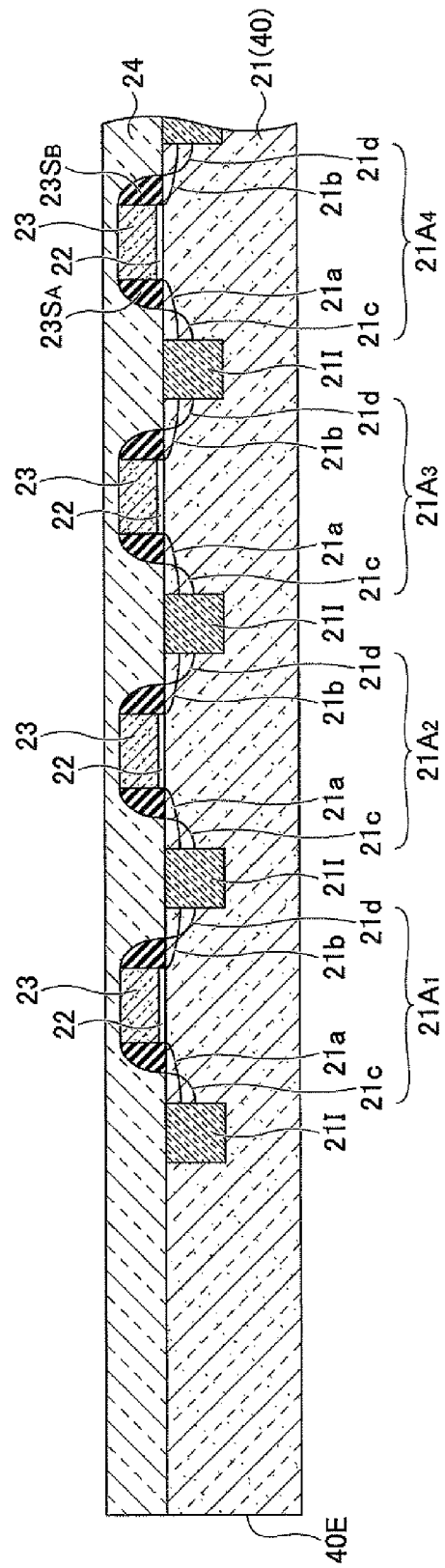

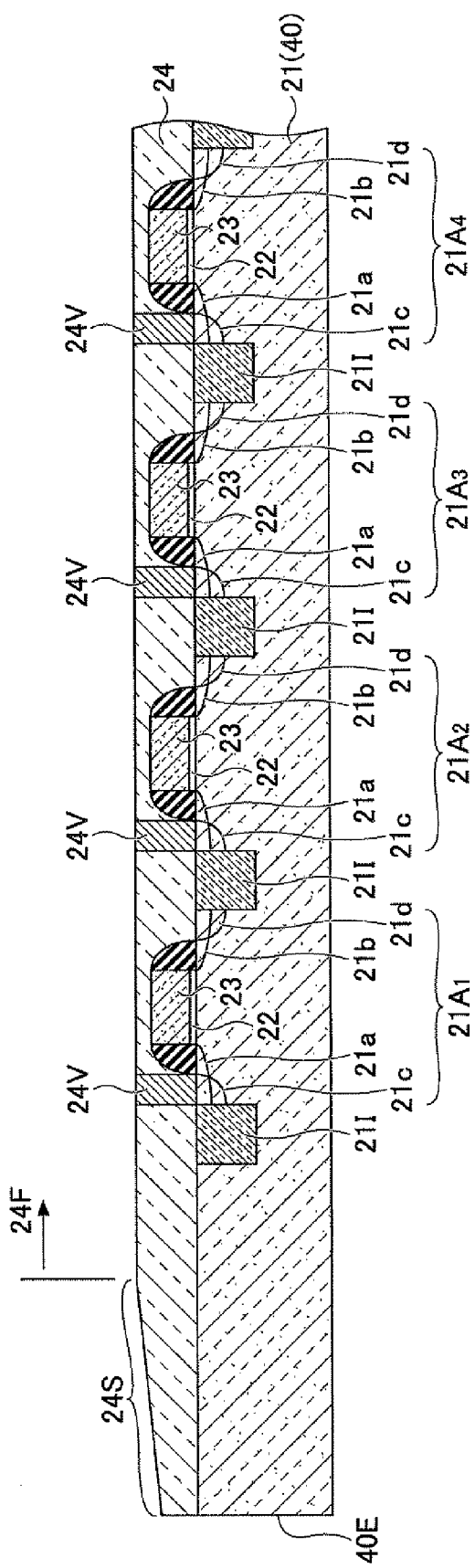

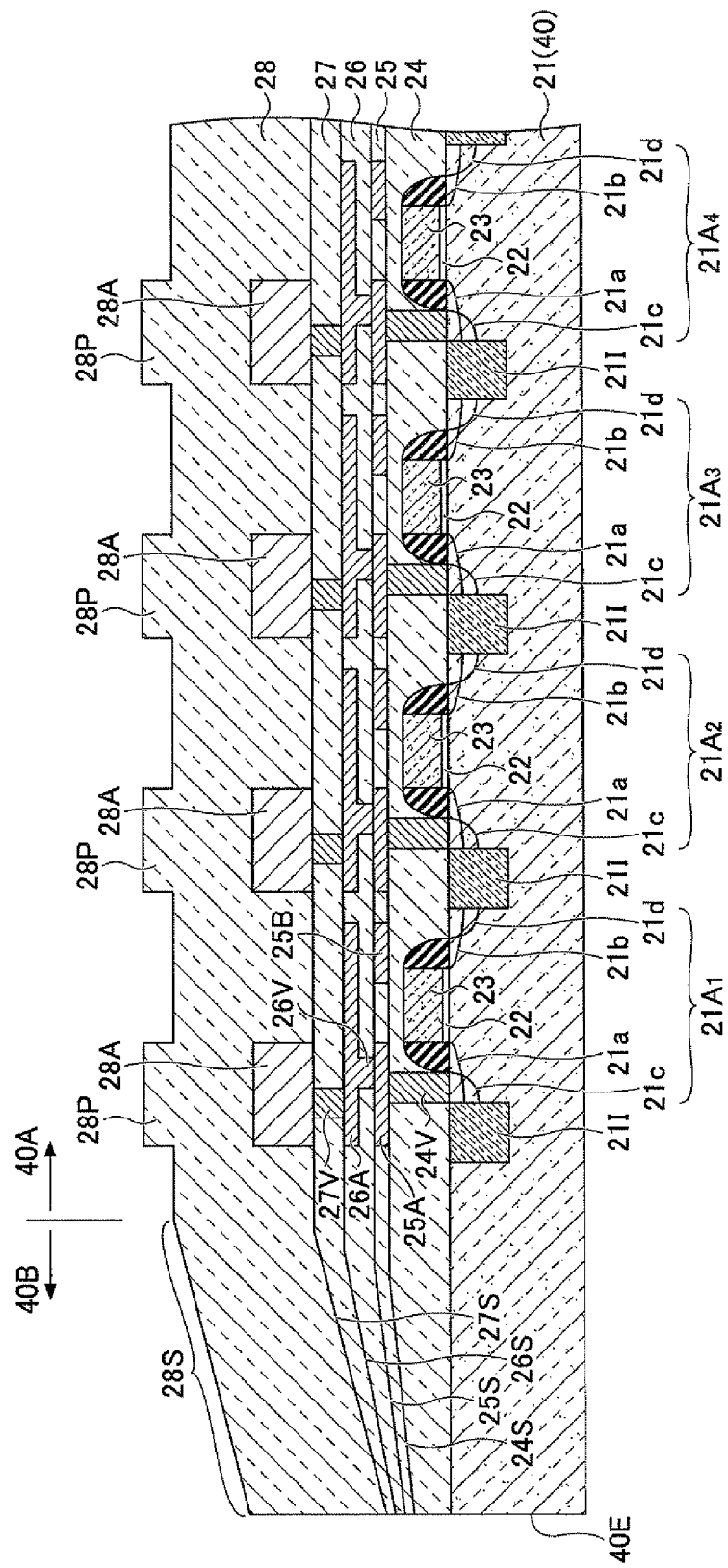

FABRICATION OF SEMICONDUCTOR DEVICE INCLUDING CHEMICAL MECHANICAL POLISHING

CROSS-REFERENCE TO RELATED APPLICATIONS

The present application is based upon and claims the benefit of priority from the prior Japanese Patent Application No. 2012-099259 filed on Apr. 24, 2012, with the Japanese Patent Office, the entire contents of which are incorporated herein by reference.

FIELD

The embodiments described herein relate to fabrication of a semiconductor device.

BACKGROUND

Chemical mechanical polishing is a technology of planarizing a metal film or insulation film on a semiconductor wafer by way of polishing and is used extensively in fabrication of various semiconductor devices.

RELATED-ART DOCUMENTS

Patent Document

Patent Reference 1 Japanese Laid-Open Patent Application 2002-252194

SUMMARY

In an aspect, there is provided a method of fabricating a semiconductor device that includes forming a first insulation film over a semiconductor substrate, the semiconductor substrate including an outer region and an inner region located at an inner side of the outer region, forming a first wiring over the first insulation film in the inner region, forming a second insulation film over the first wiring and over the first insulation film, decreasing a film thickness of the second insulation film in the inner region with regard to a film thickness of the second insulation film in the outer region, and polishing the second insulation film after the decreasing of the film thickness of the second insulation film.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described with reference to the accompanying drawings.

[First Embodiment]

In the case a chemical mechanical polishing process is applied to a semiconductor wafer, there can be a situation in which a sloped surface, inclined toward the wafer edge, is formed in the wafer peripheral region in view of the absence of a layer to be polished outside the wafer edge and resultant tendency of increase of the polishing rate toward the wafer edge.

For example, when a multilayer wiring structure is formed over a semiconductor wafer by a damascene process or dual damascene process, there may be formed such an inclined or sloped surface in the interlayer insulation film of lower layer level as a result of the chemical mechanical polishing process, while such an inclined surface formed in a lower layer level works to enhance the slope of an inclined surface formed in an interlayer insulation film of an upper layer level and causes the problem of the area of the inclined surface extending toward the inner region of the wafer. When such an inclined surface is formed in the interlayer insulation film, there may be caused a problem of incomplete via-hole formation at the time of forming via-holes by using high-resolution optical exposure technology due to insufficient focal depth of the optical system used in such high-resolution exposure technology. When this incomplete via-hole formation occurs, there arises a problem that the desired electric contact may not be attained.

Figure 1:
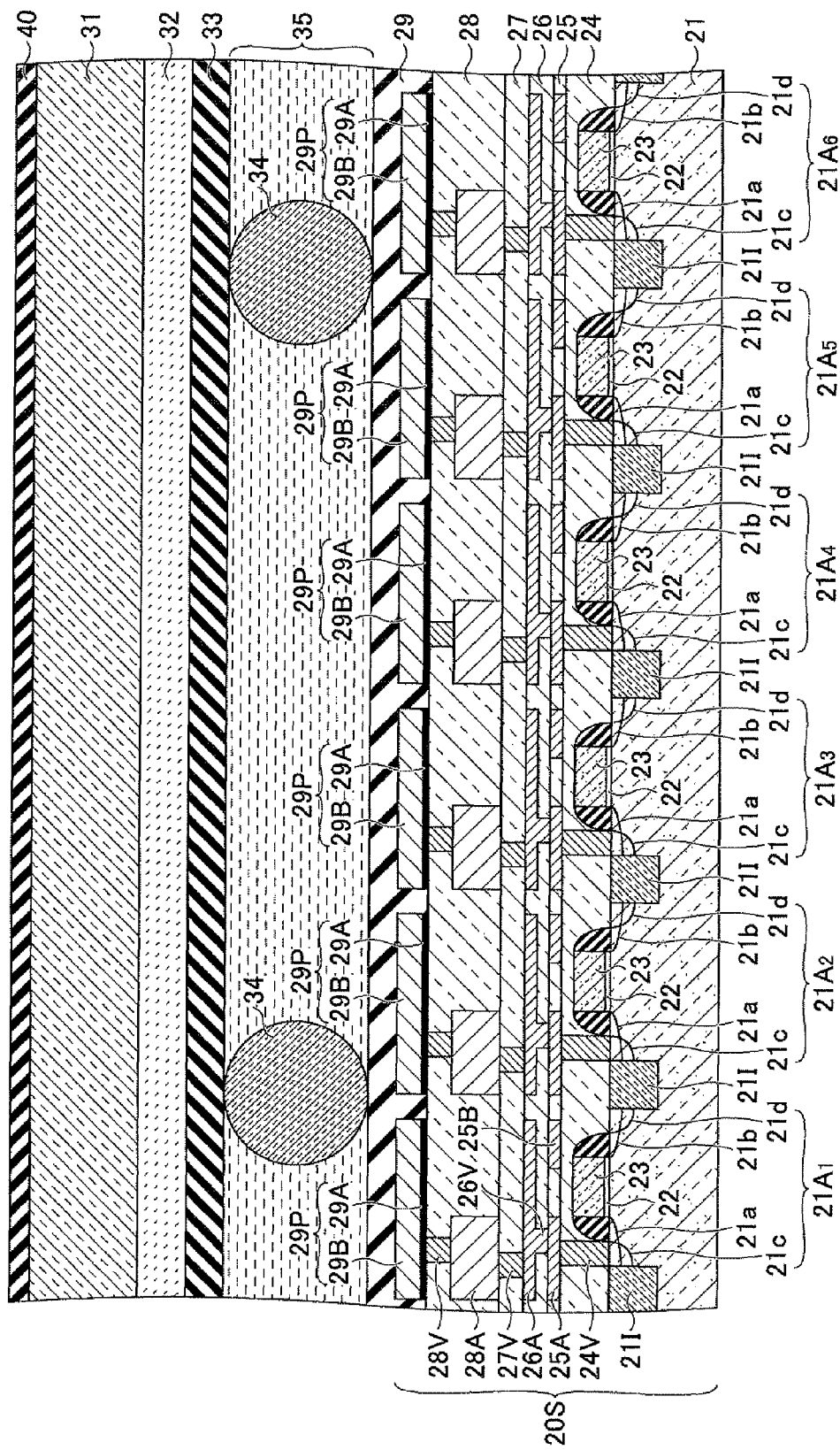
FIG. 1 is a cross-sectional diagram of a reflection-type liquid crystal display device to which the fabrication method of the first embodiment is applied.

FIG. 1 is a cross-sectional diagram representing the construction of a reflection type liquid display device 20 as an example of the semiconductor device fabricated with a first embodiment. It should be noted, however, that the present embodiment is never limited to the fabrication of such a reflection type liquid display device 20.

Referring to FIG. 1, the reflection type liquid display device 20 is constructed over a silicon substrate 21 formed with a device isolation region 21I such that there are formed device regions $21A_1$, $21A_2$, $21A_3$ ... on the silicon substrate 21 in correspondence to the respective pixel regions in a state defined with the device isolation region. In each of the device regions $21A_1$, $21A_2$, $21A_3$..., there is formed a gate electrode 23 on the silicon substrate 21 via a gate insulation film 22 in a state of carrying sidewall insulation films, and the silicon substrate 21 is formed with a drain extension region 21a and a source extension region 21b to oppose with each other across a channel region (not illustrated) right underneath the gate electrode 23. Further, a drain region 21c and a source region 21d are formed at respective outer sides of the sidewall insulation films to overlap with the drain extension region 21a and the source extension region 21b, respectively. The gate electrode 23, the source extension region 21b, the drain extension region 21a, the source region 21d and the drain region 21c constitute together a drive transistor that drives a corresponding pixel.

Hereinafter, the explanation will be made only for the device region $21A_1$ and the explanation for other device regions $21A_2$, $21A_3$ ... will be omitted in view of the fact that the construction of the reflection-type liquid display device 20 is similar also in these device regions.

Referring to FIG. 1, again, it can be seen that the gate electrode 23 is covered with an insulation film 24 formed over the silicon substrate and there is formed a via-plug 24V in the insulation film 24 in contact with the drain region 23c.

Over the insulation film 24, there is formed a first interlayer insulation film 25, and wiring patterns 25A and 25B of Cu, for example, are formed in the first interlayer insulation film 25 by way of a damascene process. The wiring pattern 25A is formed over the via-plug 24V and makes an electric contact with the drain region 21c via the via-plug 24V.

Over the first interlayer insulation film 25, there is formed a second interlayer insulation film 26, and a wiring pattern 26A of Cu, for example, including a via-plug 26V is formed in the interlayer insulation film 26 by a dual damascene process such that the via-plug 26V makes a contact with the Cu wiring pattern 25A.

Over the second interlayer insulation film 26, there is formed a third interlayer insulation film 27, and a via-plug 27V of W, for example, is formed in the third interlayer insulation film 27 by a damascene process in contact with the Cu wiring pattern 26A.

Further, there is formed a connection pad of Al, for example, over the third interlayer insulation film 27 in contact with the via-plug 27V, and a fourth interlayer insulation film 28 is formed to cover the connection pad 28A. Further, a via-plug 28V of W, for example, is formed in the fourth interlayer insulation film 28 in contact with the connection pad 28A.

Over the interlayer insulation film 28, there is formed an optical reflection layer 29B of Au or Al, for example, in contact with the via-plug 28V via an adhesion layer 29A of a Ti/TiN stacked structure, and a first alignment layer 29 is formed over the optical reflection layer 29B for aligning the orientation of the liquid crystal molecules. The adhesion layer 29A and the optical reflection layer 29B forms together a pixel electrode 29P of the liquid crystal display device 20 in the respective device regions $21A_1$, $21A_2$, $21A_3$ ....

Over the silicon substrate 21, there is disposed a glass substrate 31 carrying thereon a transparent electrode 32 and a second alignment layer 33 such that the second alignment layer 33 faces the first alignment layer 29 via a spacer 34 of a predetermined diameter, and the space between the alignment layers 29 and 33 is filled with a liquid crystal layer 35. Further, a polarizer 40 is disposed over the glass substrate 31.

When a drive voltage is applied to the pixel electrode 29P in the device region 21A1, for example, via a corresponding drive transistor in such a reflection type liquid crystal display device 20, there is induced a change of alignment of liquid crystal molecules in the liquid crystal layer 35 by the electric field formed between the pixel electrode 29P and the opposing electrode 32. Thus, an incident light entered into the glass substrate 31 after passing through the polarizer 40 undergoes modulation as it passes through the liquid crystal layer 35 before being reflected by the optical reflection layer 29B and further as it passes through the liquid crystal layer 35 again. With this, it becomes possible to display the desired image or data visually.

In the cross-sectional diagram of FIG. 1, it should be noted that the silicon substrate 21, the source extension region 21b and the drain extension region 21a, the source region 21d and the drain region 21c, the interlayer insulation films 24-28, the via-plugs 24V, 26V, 27V and 28V, the Cu wiring patterns 25A and 26A, the connection pad 28A, the adhesion layer 29A and the optical reflection layer 29B constitutes together a semiconductor device 20S.

Figure 2:
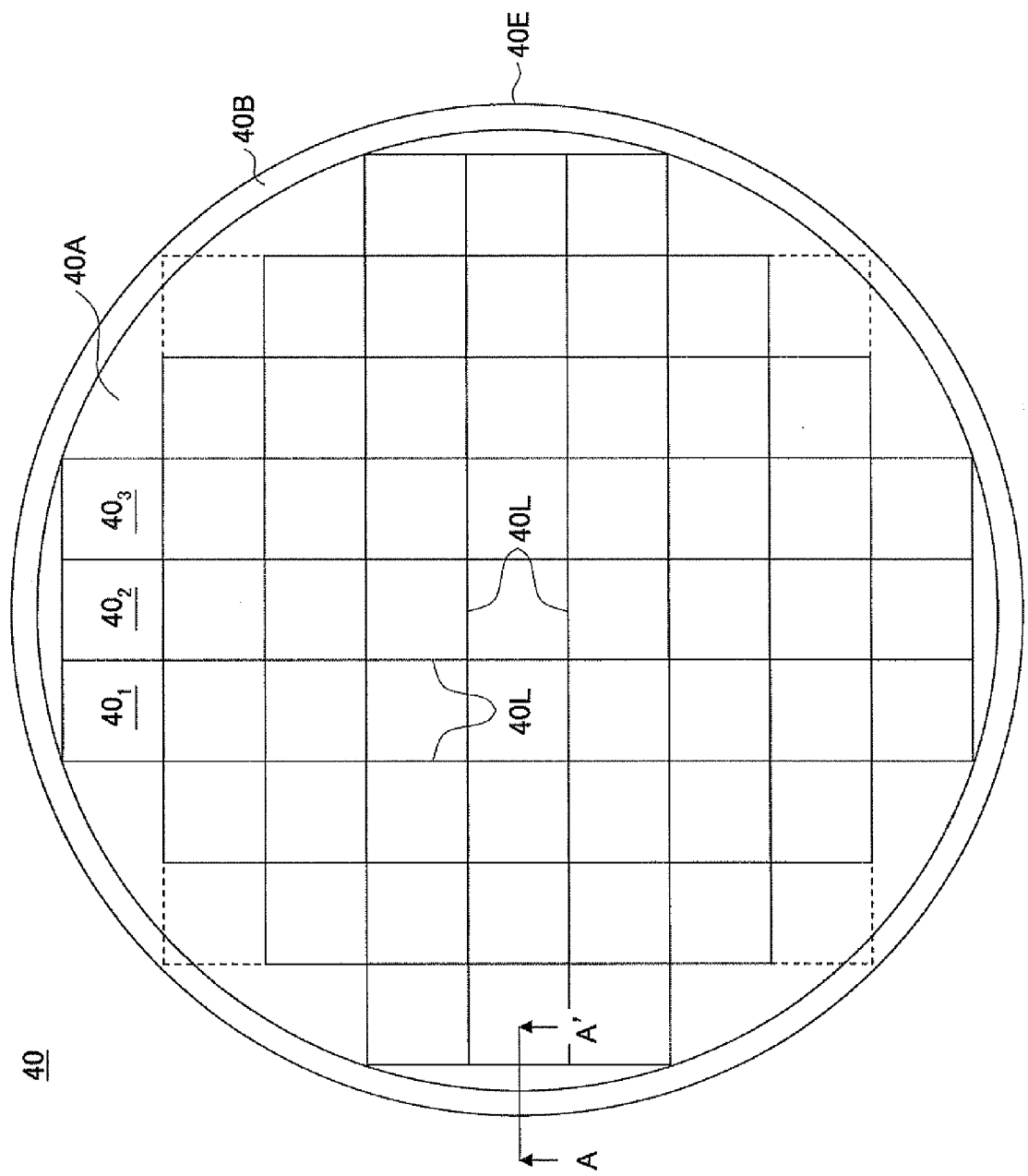
FIG. 2 is a plan view diagram representing a silicon wafer to which the first embodiment is applied.

FIG. 2 is a plan view diagram representing a silicon wafer 40 used for the fabrication of the reflection type liquid crystal display device 20 and is formed with the semiconductor device 20S.

Referring to FIG. 2, there are defined a large number of chip regions $40_1$, $40_2$, $40_3$ ... on the silicon wafer 40 by scribe lines 40L, wherein the semiconductor device 20S noted before is formed in each of the chip regions $40_1$, $40_2$, $40_3$ ..., on the silicon substrate 21, and each of the semiconductor devices 20S includes the device regions $21A_1$, $21A_2$, $21A_3$ ....

As explained previously, such formation of the semiconductor device 20S on the silicon wafer 40 includes a damascene process or dual damascene process, and associated therewith, the silicon wafer 40 experiences chemical mechanical polishing process repeated a plurality of times.

Referring to FIG. 2, it will be noted that the silicon wafer 40 has an edge 40E, beyond which there exists no material to be polished. Thus, when a chemical mechanical polishing process is applied to such a silicon wafer, 40, there is a tendency of formation of inclined or sloped surface inclined or sloped toward the edge 40E in view of the fact that there occurs an increase of polishing rate in a peripheral part 40B adjacent to the edge 40E. Now, when the chip regions $40_1$, $40_2$, $40_3$ ... have included such an inclined surface, there is formed a corresponding inclined surface in the interlayer insulation films 24-48, and there arises a problem that via-plugs, formed by using high-resolution optical exposure technology, may not be able to attain the desired electrical contact because of incomplete via-hole formation. A high-resolution optical system used for minute via-hole formation tends to suffer from the problem of shortage of focal depth. Thus, the via-plugs 24V, 26V, 27V and 28V in the interlayer insulation films 24 and 26-28 may fail to attain the desired electrical contact in the illustrated example. Further, when the optical reflection layer 29B is formed on such an inclined surface, the exit direction of the reflection light may be offset from the nominal direction, leading to the problem of defective image display.

Thus, in the case of forming such a semiconductor device 20S on the silicon wafer 40, it is preferable to reduce the proportion of the peripheral part 40B as much as possible and increase the proportion of an inner region 40A at an inner side of the peripheral region 40B as much as possible. In the description hereinafter, the peripheral part 40B will be designated also as outer region 40B.

Figure 3A:
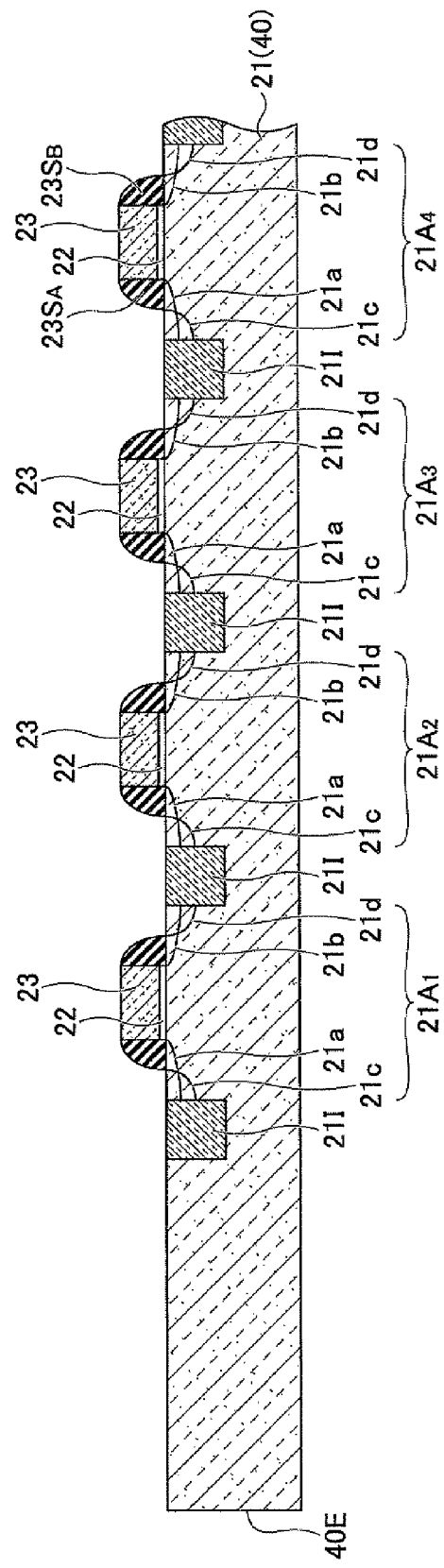
FIGS. 3A-3O are cross-sectional process flow diagrams representing the process of fabricating the semiconductor device according to a first embodiment.

Hereinafter, the present embodiment will be explained with reference to the process flow cross-sectional diagrams of FIGS. 3A-3O. It should be noted that the process flow cross-sectional diagrams of FIGS. 3A-3O represent a cross-section taken along a line A-A' of the silicon wafer 40 of FIG. 2. In FIGS. 3A-3O, those parts explained before are designated by the same reference numerals and the description thereof will be omitted.

Referring to FIG. 3A, the device isolation region 21I defines the device regions $21A_1$, $21A_2$, $21A_3$ ... on the silicon substrate 21, wherein it should be noted that the silicon substrate 21 corresponds to a part of the silicon wafer 40. In FIG. 3A, it can be seen further that each of the device regions is formed with the gate electrode 23 via a gate insulation film 22 and that the gate electrode 23 carries sidewall insulation films $23S_A$ and $23S_B$ on the respective, mutually opposing sidewall surfaces. Further, the drain extension region 21a and the source extension region 21b are formed in the silicon substrate 21 at the respective sides of the sidewall insulation films 23S$_A$ and 23S$_B$ so as to oppose across the channel region right underneath the gate electrode 23. Further, the drain region 21c and the source region 21d are formed respectively in overlapping with the drain extension region 21a and the source extension region 21b at the respective outer sides of the sidewall insulation films 23S$_A$ and 23S$_B$.

Next, in the step of FIG. 3B, the insulation film 24 is formed on the structure of FIG. 3A, and the via-plug 24A is formed in the insulation film 24 in the step of FIG. 3C by a damascene process in each of the device regions 21A$_1$, 21A$_2$, 21A$_3$ . . . . More specifically, a via-hole is formed in the insulation film 24 to expose the drain regions 21c in the respective device regions 21A$_1$, 21A$_2$, 21A$_3$ . . . by a photolithographic process, and the via-plug 24A is formed by filling the via-hole with a tungsten (W) layer and subsequent removal of unnecessary W layer by a chemical mechanical polishing process. In the step of FIG. 3C, it will be noted that there is formed an inclined surface 24S slightly inclined toward the wafer edge 40E on the surface of the insulation film adjacent to the wafer edge 40E as a result of the chemical mechanical polishing process such that the inclined surface surrounds a flat region 24F of the interlayer insulation film 24.

Figure 3D:
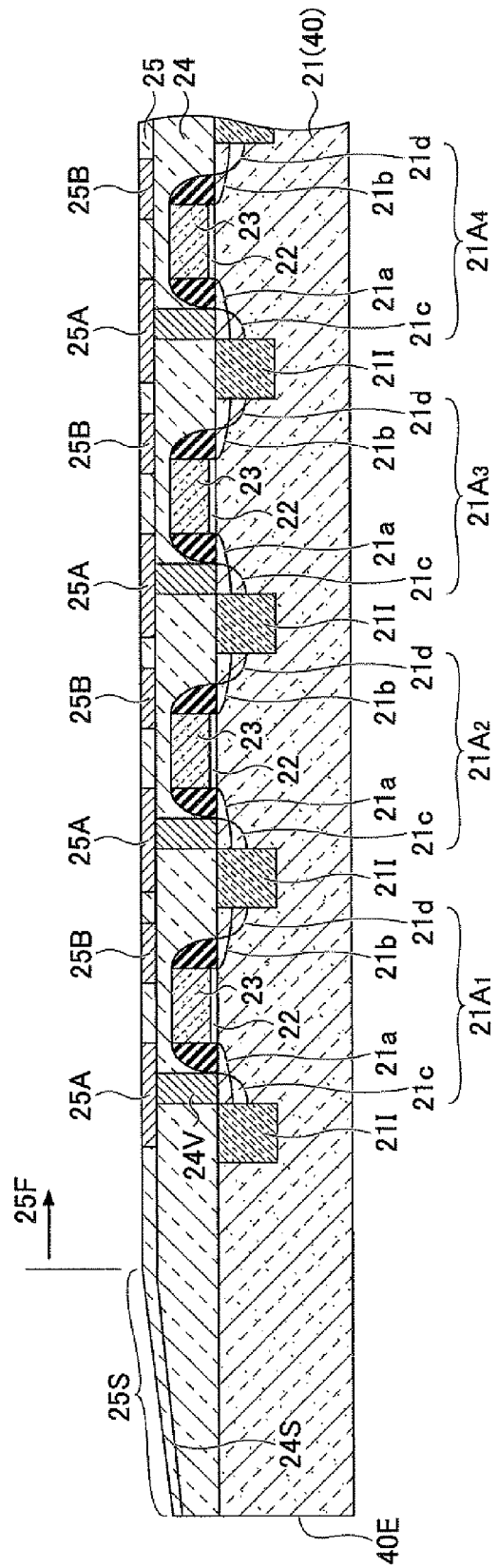

Next, in the step of FIG. 3D, the interlayer insulation film 25 is formed on the insulation film 24 and the interlayer insulation film is formed with the Cu wiring patterns 25A and 25B with a damascene process. More specifically, there is formed an opening in the interlayer insulation film 25 in correspondence to the Cu wiring patterns 25A and 25B, followed by filling the opening with a Cu layer. Further, unnecessary Cu layer is removed by a chemical mechanical polishing process, and the Cu wiring patterns 25A and 25B are formed in the interlayer insulation film 25 in a state in which the top surface is flush with a top surface of the interlayer insulation film 25.

In the step of FIG. 3D, the interlayer insulation film 25 is formed to cover the inclined surface 24S of the insulation film 24 adjacent to the wafer edge 40E, wherein interlayer insulation film 25 thus formed includes an inclined surface inclined further as a result of the chemical mechanical polishing process of the interlayer insulation film 25 as a result of decrease of film thickness associated with the chemical mechanical polishing process of the interlayer insulation film 25. As a result, an inclined surface 25S is formed in the interlayer insulation film 25 with increased inclination as compared with the inclined surface 24S adjacent to the wafer edge 40E. In the step of FIG. 3D, the extent of the inclined surface 25S is expanded as compared with the inclined surface 24S underneath, and with this, a flat region 25F of the interlayer insulation film 25 located at the inner side of the included surface 25S is reduced as compared with the flat region 24F of the underlying interlayer insulation film 24.

Figure 3E:
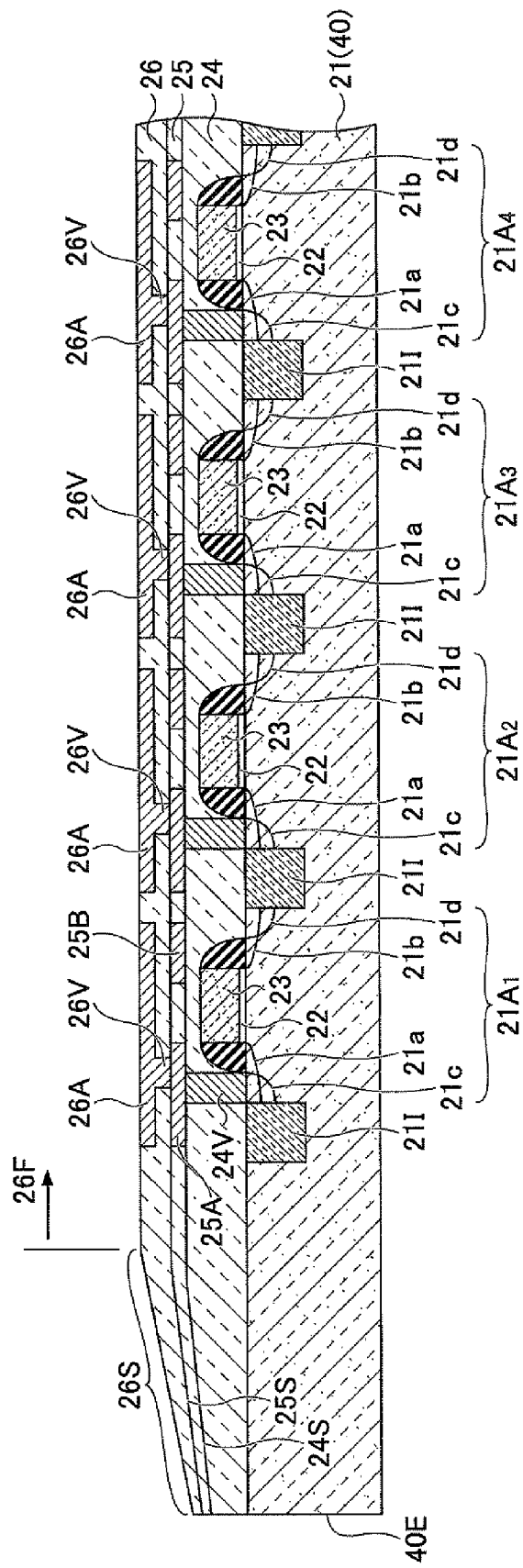

Further, in the step of FIG. 3E, the next interlayer insulation film 26 is formed over the interlayer insulation film 25 and the Cu wiring pattern 26A including the Cu via-plug 26V is formed in the interlayer insulation film 26 by a dual damascene process. More specifically, the interlayer insulation film is formed with a via-hole corresponding to the Cu via-plug 26V and an opening corresponding to the wiring pattern 26A, followed by filling the via-hole and the opening with a Cu layer. Further, by removing unnecessary Cu layer by a chemical mechanical polishing process, the Cu wiring pattern 26A is formed in the interlayer insulation film 26 accompanied with the Cu via-plug 26V, such that a top surface thereof is coincident with the top surface of the interlayer insulation film 26.

In the step of FIG. 3E, the interlayer insulation film 26 is formed to cover the inclined surface 25S of the insulation film 25 adjacent to the wafer edge 40E, wherein the interlayer insulation film 26 thus formed includes an inclined surface inclined further as a result of decrease of the film thickness associated with the chemical mechanical polishing process applied to the interlayer insulation film 26. As a result, an inclined surface 26S is formed in the interlayer insulation film 26 with increased inclination as compared with the inclined surface 25S adjacent to the wafer edge 40E. In the step of FIG. 3E, the extent of the inclined surface 26S is increased as compared with the inclined surface 25S lying underneath, and with this, the extent of a flat region 26F of the interlayer insulation film 26 located at the inner side of the inclined surface 26S is reduced as compared with the flat region 25F of the underlying interlayer insulation film 25.

Figure 3F:
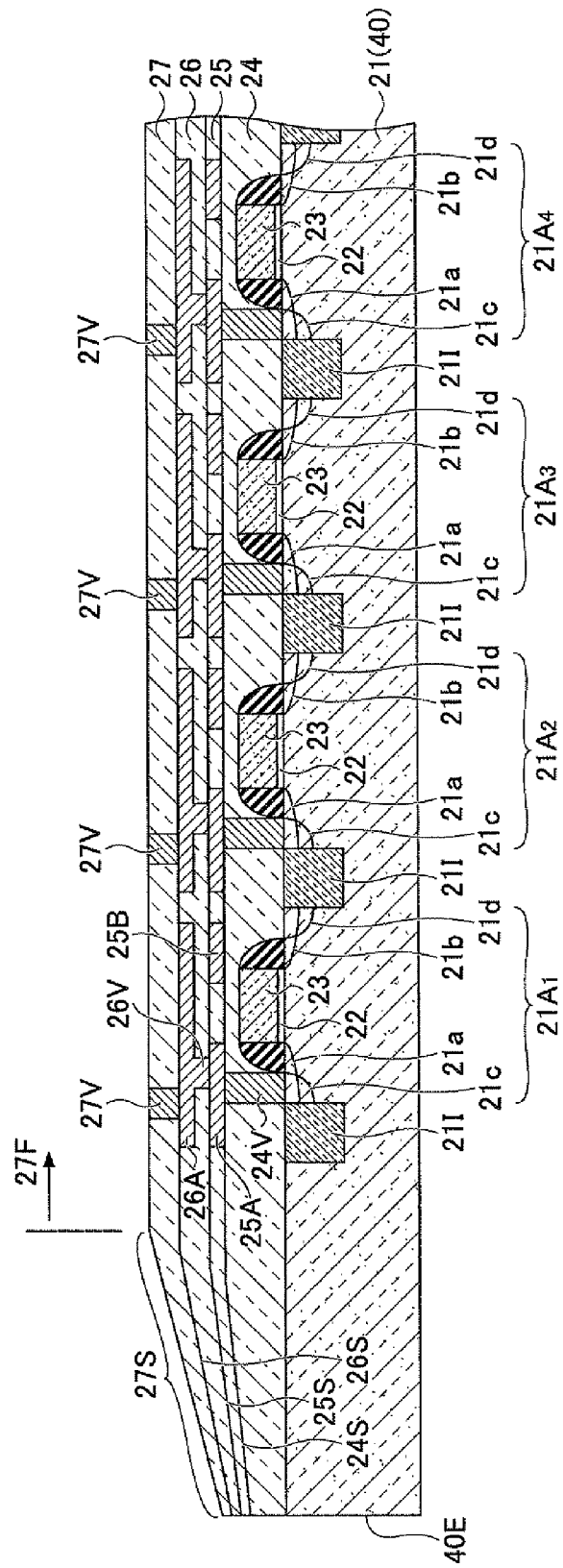

Further, with the step of FIG. 3F, the next interlayer insulation film 27 is formed over the interlayer insulation film 26, and the W via-plug 27V is formed in the interlayer insulation film 27. More specifically, there is formed a via-hole in the interlayer insulation film 27 in correspondence to the W via-plug 27V, followed by filling the via-hole with a W layer. Further, unnecessary W layer is removed by a chemical mechanical polishing process, and the W via-plug 27V is formed in the interlayer insulation film 27 in a state in which the top surface is coincident with a top surface of the interlayer insulation film 27.

In the step of FIG. 3F, the interlayer insulation film 27 is formed to cover the inclined surface 26S of the insulation film 26 adjacent to the wafer edge 40E, wherein interlayer insulation film 27 thus formed includes an inclined surface inclined further as a result of the chemical mechanical polishing process applied to the interlayer insulation film 27. As a result, an inclined surface 27S is formed in the interlayer insulation film 27 with increased inclination as compared with the inclined surface 26S adjacent to the wafer edge 40E. In the step of FIG. 3F, the extent of the inclined surface 27S is increased as compared with the inclined surface 26S lying underneath, and with this, the extent of a flat region 27F of the interlayer insulation film 27 located at the inner side of the included surface 27S is reduced as compared with the flat region 26F of the underlying interlayer insulation film 26.

Figure 3G:
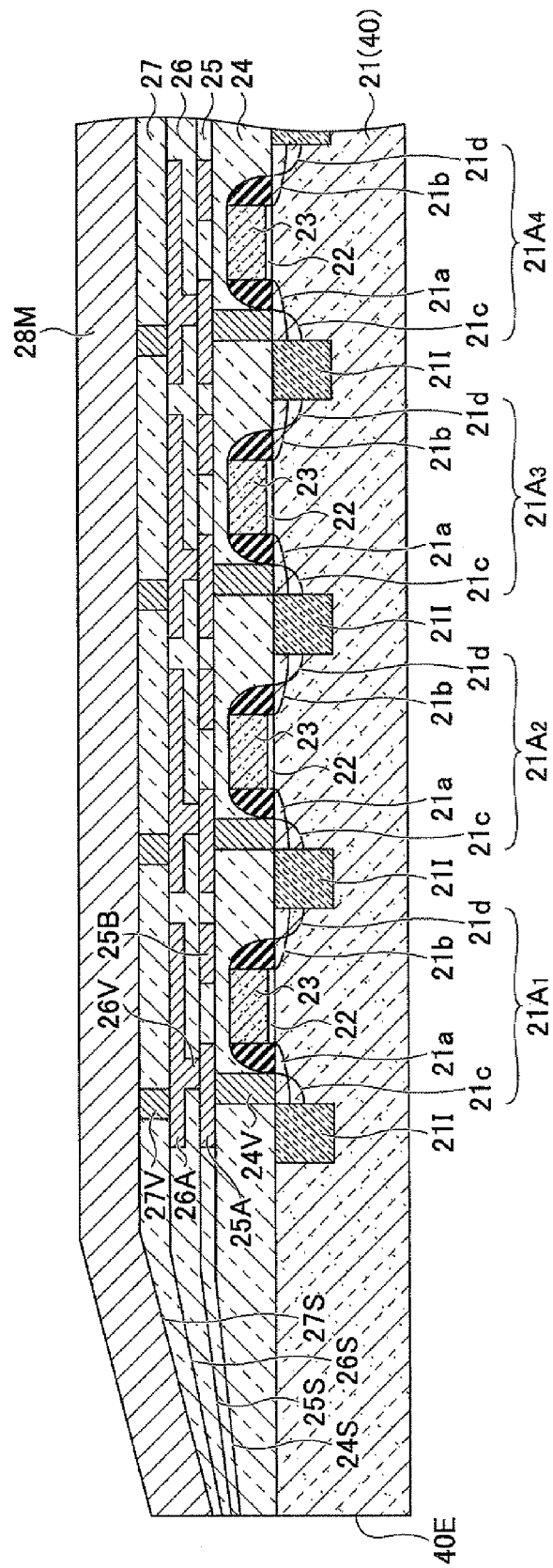

In the step of FIG. 3G, an Al film 28M is formed over the interlayer insulation film 27 by a sputtering process, for example, with a thickness larger than the thickness of the interlayer insulation films 25-27 to cover the flat surface of the interlayer insulation film 27 corresponding to the inner region 40A and further the inclined surface 27S of the interlayer insulation film 27 corresponding to the outer region 40B. Further, the Al film 28M is pattered in the step of FIG. 3H, and the connection pads 28A are formed on the flat region 27F of the interlayer insulation film 27 in correspondence to each of the device regions 21A$_1$, 21A$_2$, 21A$_3$ . . . .

Figure 3H:
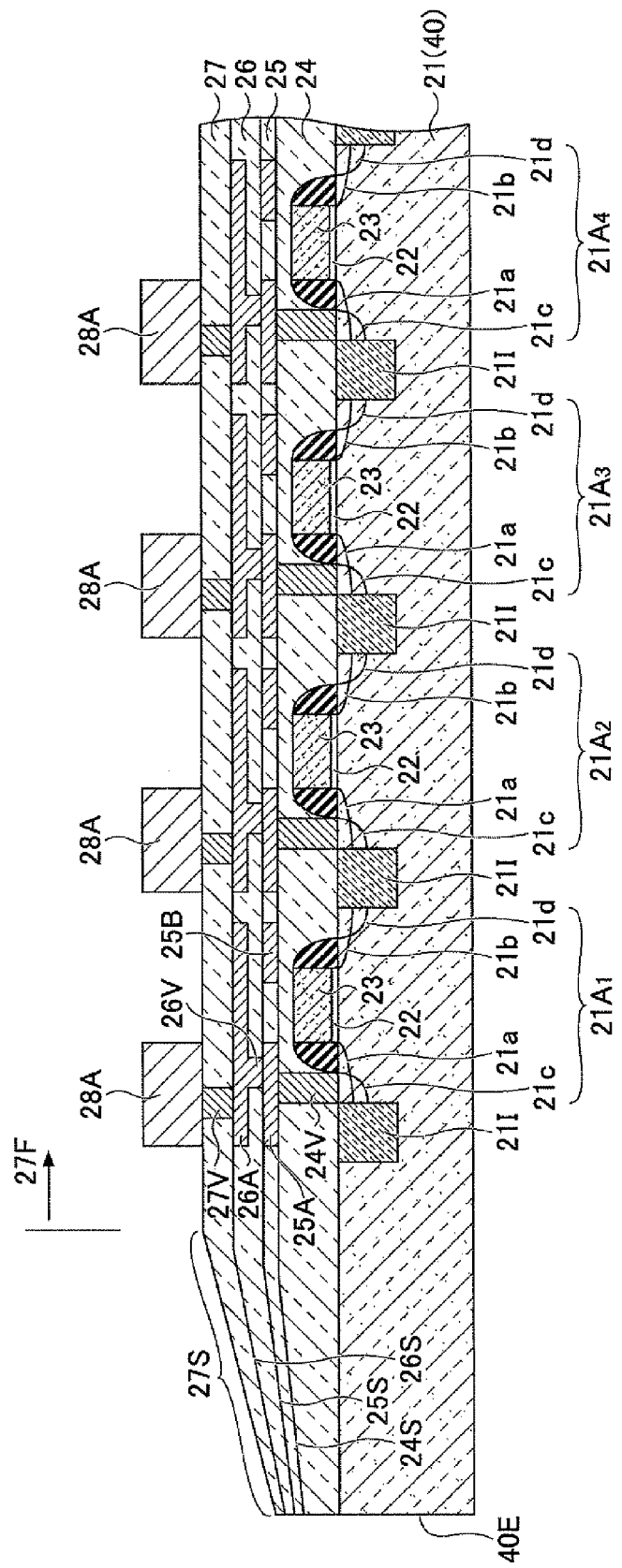

Next, in the step of FIG. 3I, the interlayer insulation film 28 is formed on the interlayer insulation film 27 to cover the connection pad 28A of FIG. 3H with a thickness sufficient to cover the connection pad 28A such as a thickness exceeding twice as large as the height of the connection pad 28A, by a CVD process, for example, with a shape conformal to the underlying layer. The interlayer insulation film 28 thus formed includes, in a top surface thereof, a projection 28P corresponding to the connection pad 28A and further an inclined surface 28S corresponding to the inclined surface 27S of the interlayer insulation film 27. Because there is no chemical mechanical polishing process is included after the step of FIG. 3F until the step of FIG. 3H, it should be noted that the boundary between the flat region 27F and the inclined surface 27S of the interlayer insulation film 27 remains the same as in the case of FIG. 3F.

Figure 3J:
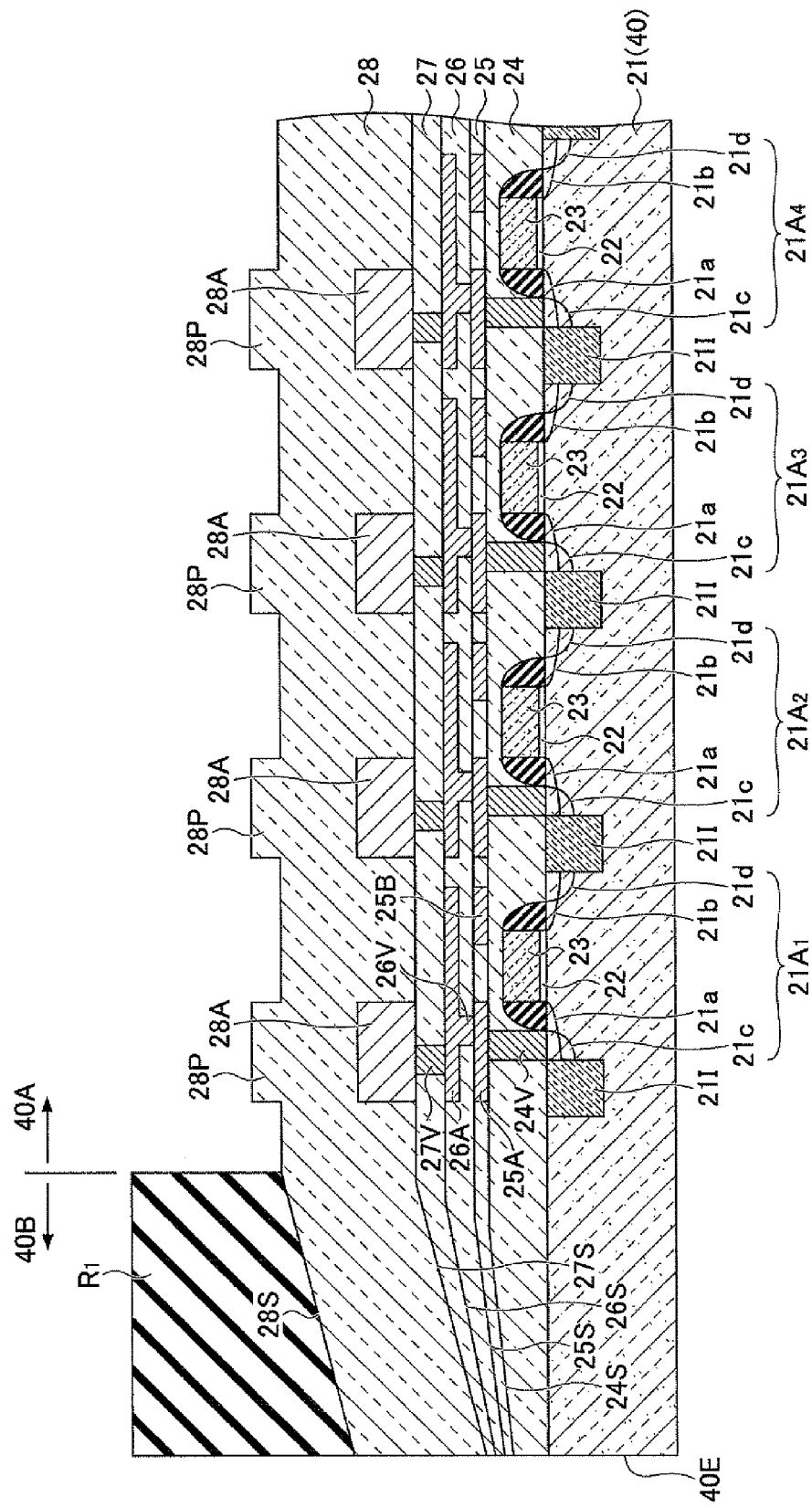
Figure 4:
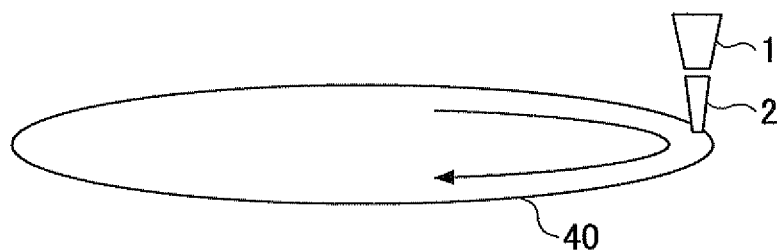
FIG. 4 is an oblique view diagram explaining the exposure process in the step of FIG. 3J.

Next, in the step of FIG. 3J, a resist pattern $R_1$ is formed to cover the inclined surface 28S of the interlayer insulation film 28 by using a negative type resist. It should be noted that such a resist pattern $R_1$ can be formed by applying the resist film uniformly on the structure of FIG. 3I and by locally exposing the resist film by an optical beam 2 of an optical source 1 to expose the outer peripheral part of the wafer while rotating the wafer 20 as represented in FIG. 4. It should be noted that the inclined surface 28S of the interlayer insulation film 28 corresponds to the outer region 40B in the plan view diagram of FIG. 2 and the flat region 28F of the interlayer insulation film 28 corresponds to the inner region 40B of the plan view diagram of FIG. 2. It should be noted that the interlayer insulation film 28 covers the connection pad 28A in the inner region 40A.

Figure 3K:
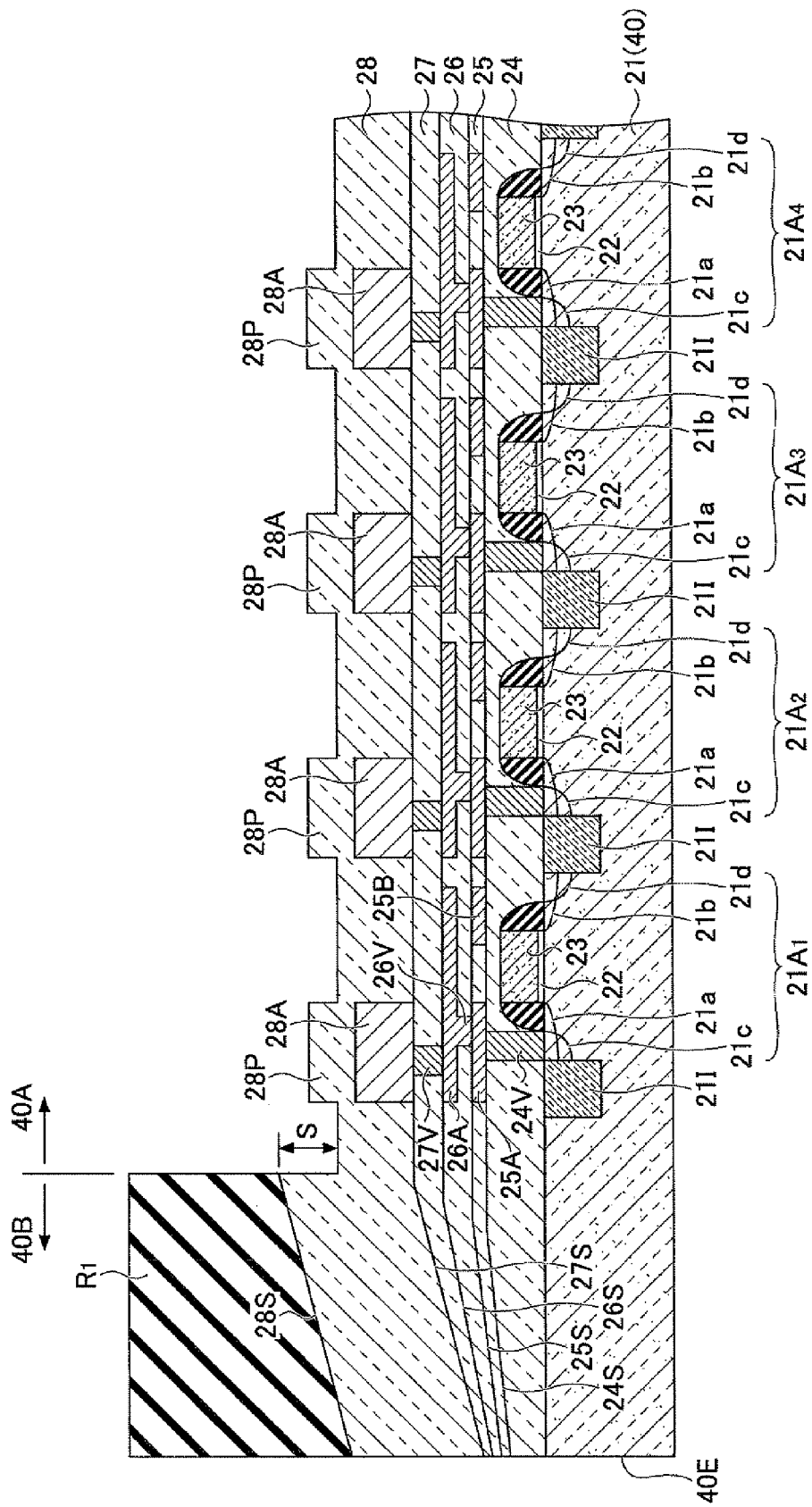

Next, in the step of FIG. 3K, the present embodiment etches back the top surface of the interlayer insulation film 28 by an anisotropic etching process working generally perpendicularly to the surface of the silicon substrate 21 while using the resist pattern $R_1$ as a mask, to reduce the film thickness of the interlayer insulation film 28 in the inner region 40A to the extent that the connection pad 28A is not exposed. In the case the interlayer insulation film 28 is formed to a film thickness exceeding twice the height of the connection region 28A, it is possible to avoid the exposure of the connection pad 28A out from the interlayer insulation film 28 when the etchback is applied to decrease the film thickness of the interlayer insulation film 28 to one half or less. As a result of such an etch back process, there is formed a step S in the interlayer insulation film 28 at the boundary between the outer region 40B and the inner region 40A in correspondence to the amount of the etchback.

Figure 3L:
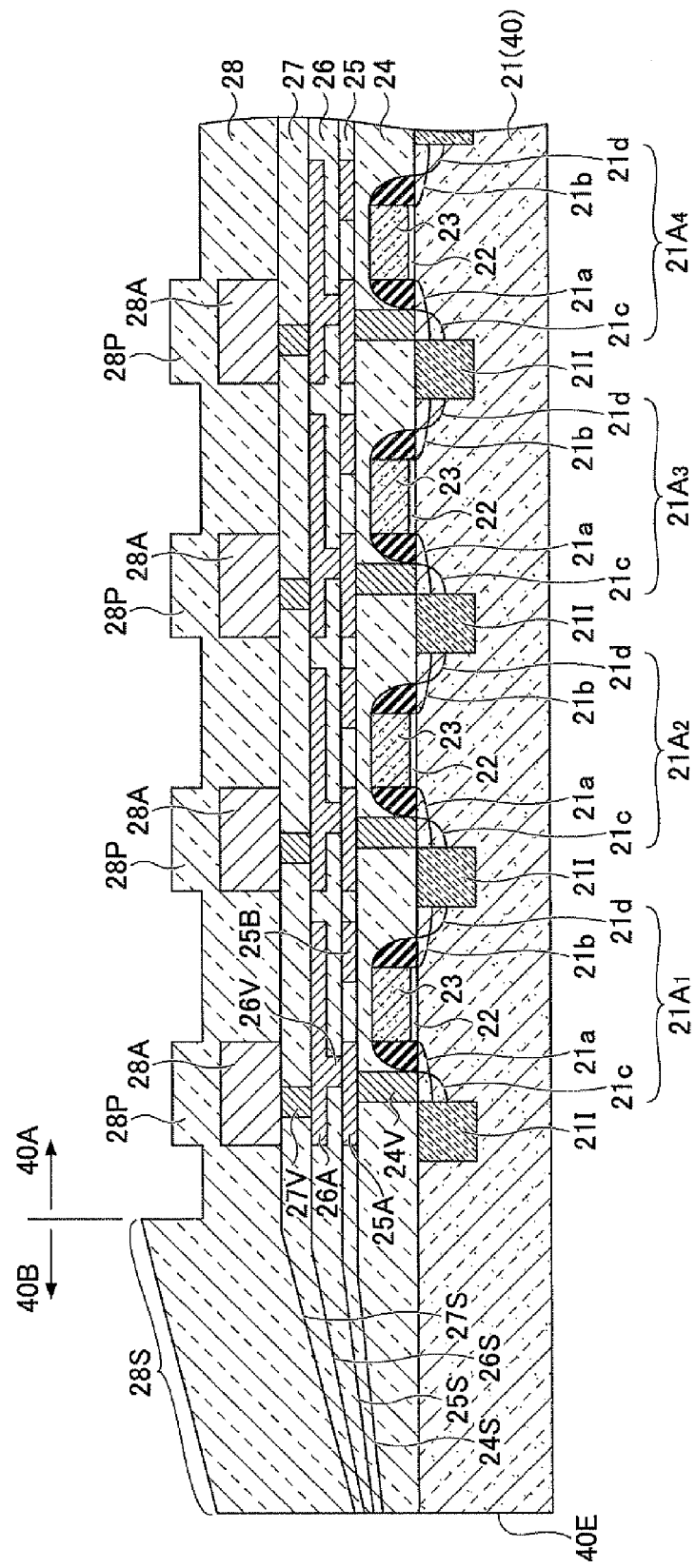
Figure 3M:
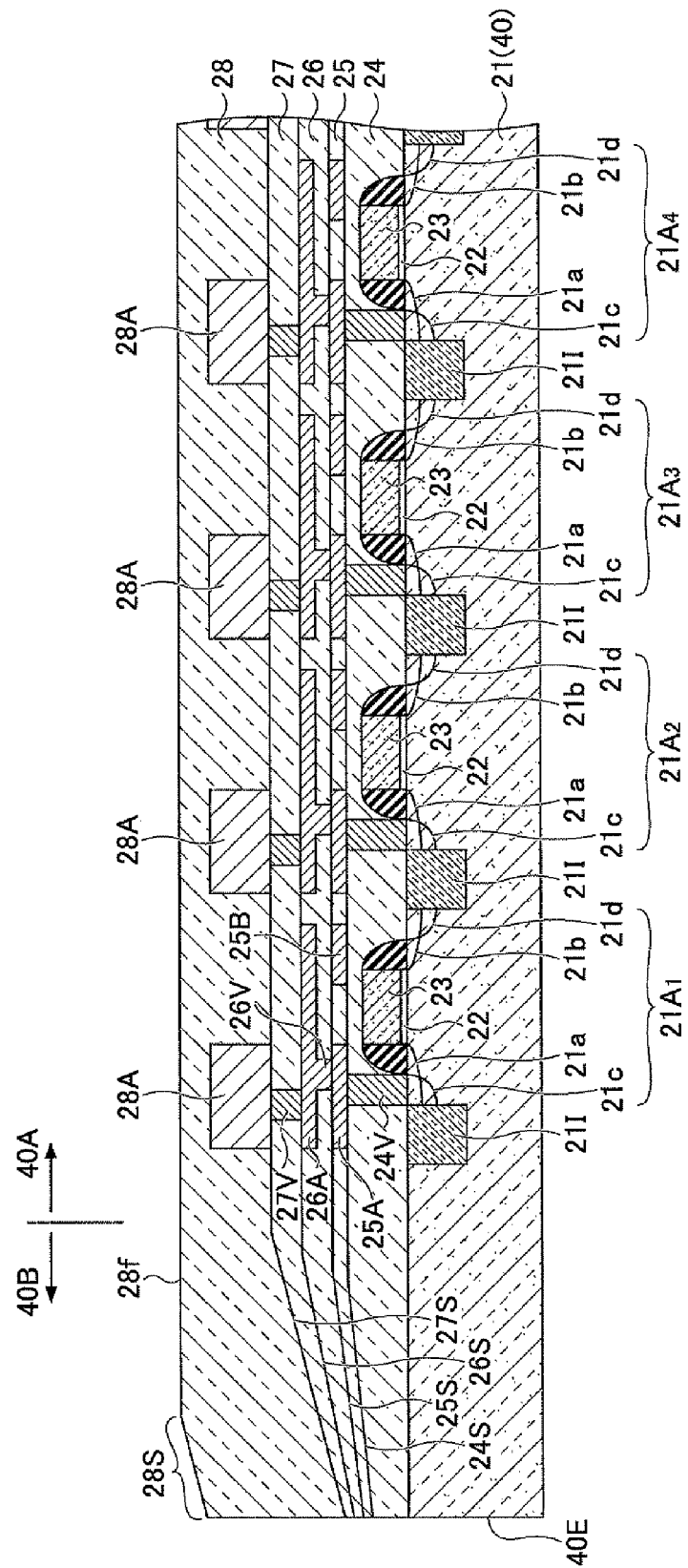

Next, in the step of FIG. 3L, the resist pattern $R_1$ of FIG. 3K is removed and the interlayer insulation film 28 is planarized in the step of FIG. 3M by a chemical mechanical polishing process. In this process of FIG. 3M, the polishing of the interlayer insulation film 28 proceeds generally uniformly in the outer region 40B as well as in the inner region 40A in view of the fact that there is formed a projection having an inclined surface 28S in the interlayer insulation film 28 as represented in FIG. 3L along the entire periphery of the wafer 40 in correspondence to the outer region 40B of the wafer 40. As represented in FIG. 3L, the projection thus formed forms a step S at the boundary between the outer region 40B and the inner region 40A. As a result, there occurs shrinkage in the inclined surface 28S as represented in FIG. 3M and there is formed a planarized surface $28f$ in the top surface of the interlayer insulation film 40B such that the planarized surface $28f$ extends into the outer region 40B.

Figure 3N:
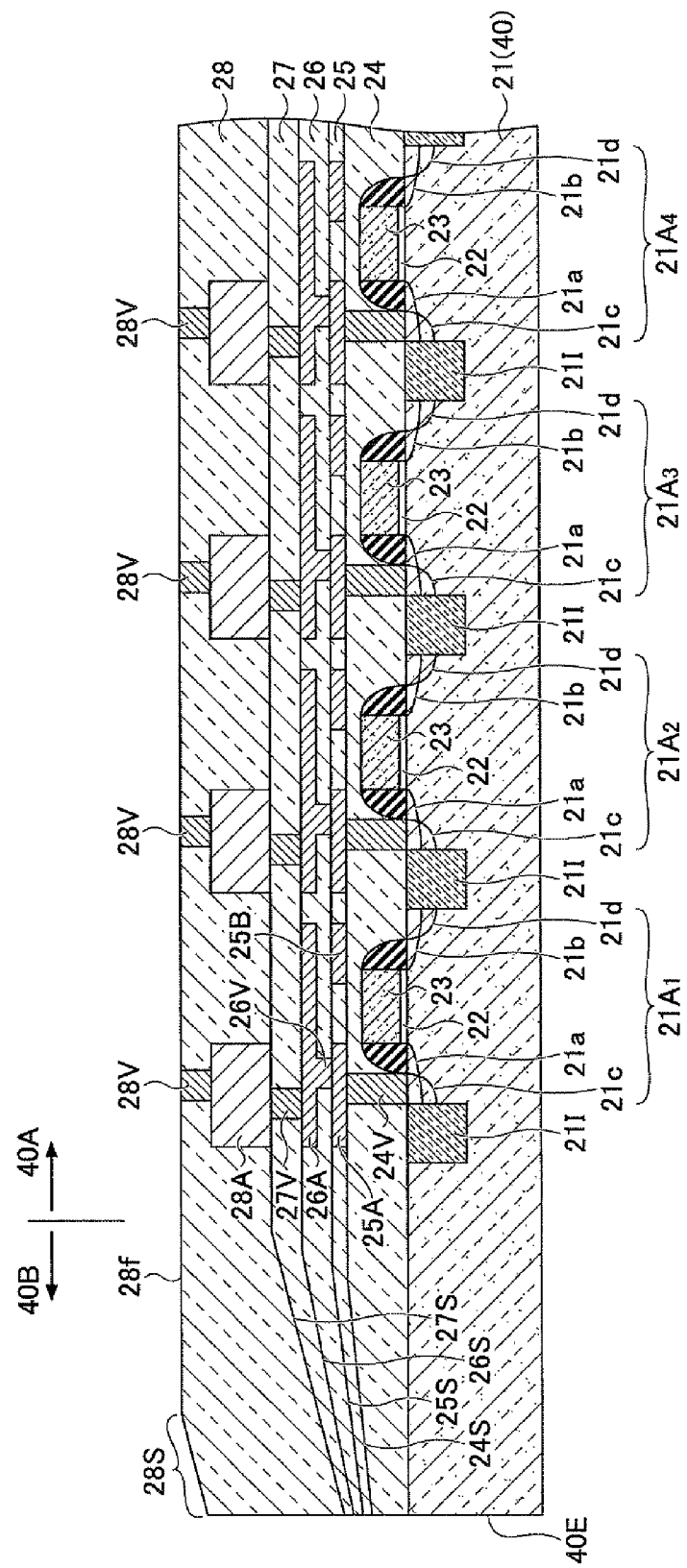
Figure 30:
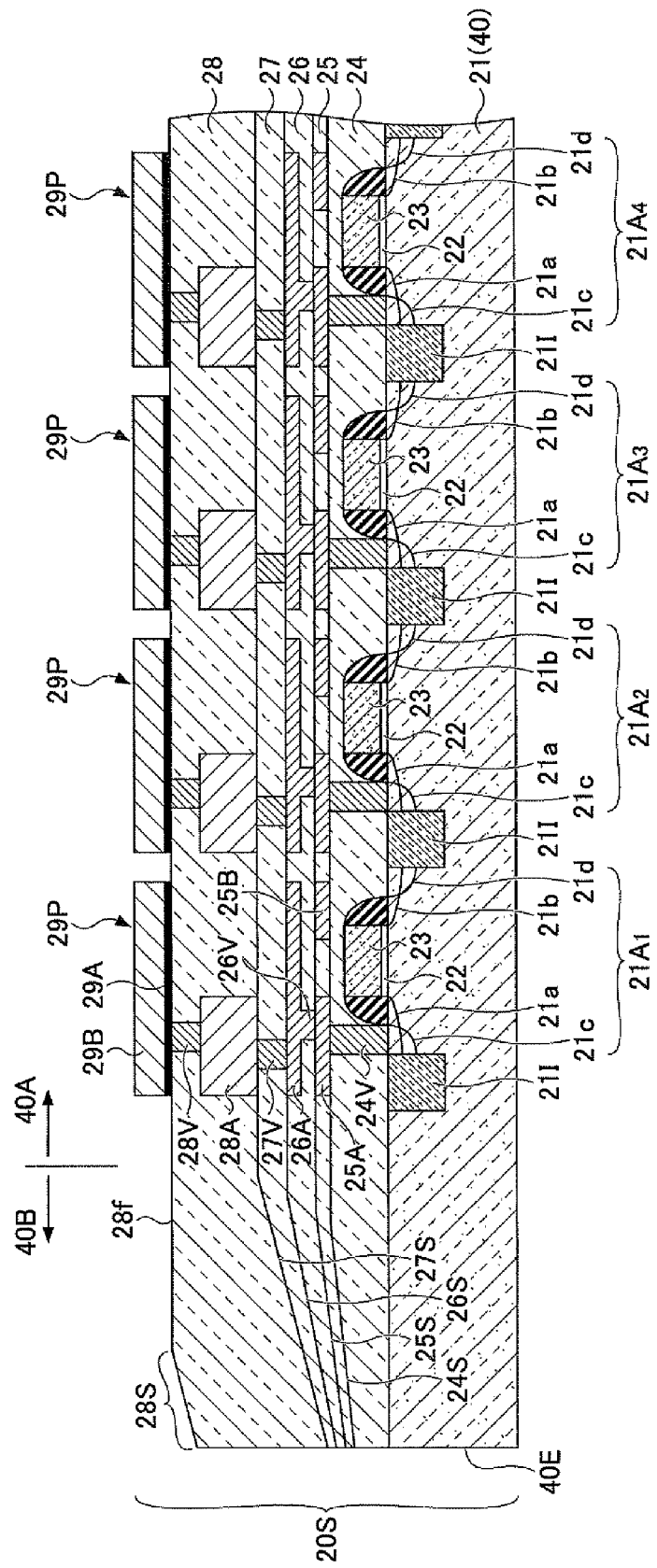

Next, in the step of FIG. 3N, there are formed W via-plugs 28V in the interlayer insulation film 28 by a damascene process respectively in the device regions $21A_1$, $21A_2$, $21A_3$ .... Further, in the step of FIG. 3O, a pixel electrode 29 is formed on the planarized surface $28f$ of the interlayer insulation film 28 in the form of stacking of a Ti/TiN adhesion layer 29A and an optical reflection layer 29B of Au or Al. With this, the semiconductor device 20S is obtained.

With such a semiconductor device 20S thus formed, it should be noted that the formation of the via-plugs 28V is conducted to the planarized surface $28f$ of the interlayer insulation film 28, and because of this, it becomes possible to form all the via-plugs 28V with certainty even in such a case of using a high-resolution optical system of characteristically shallow focal depth at the time of the photolithography. Further, because the pixel electrode 29B, which includes the optical reflection layer 29B therein, is formed on such a planarized surface $28f$, there occurs no such a problem that the direction of the exit light is deflected from the desired direction at the time of reflection of the incident light, and it becomes possible to improve the yield of production of the semiconductor device.

Figure 5:
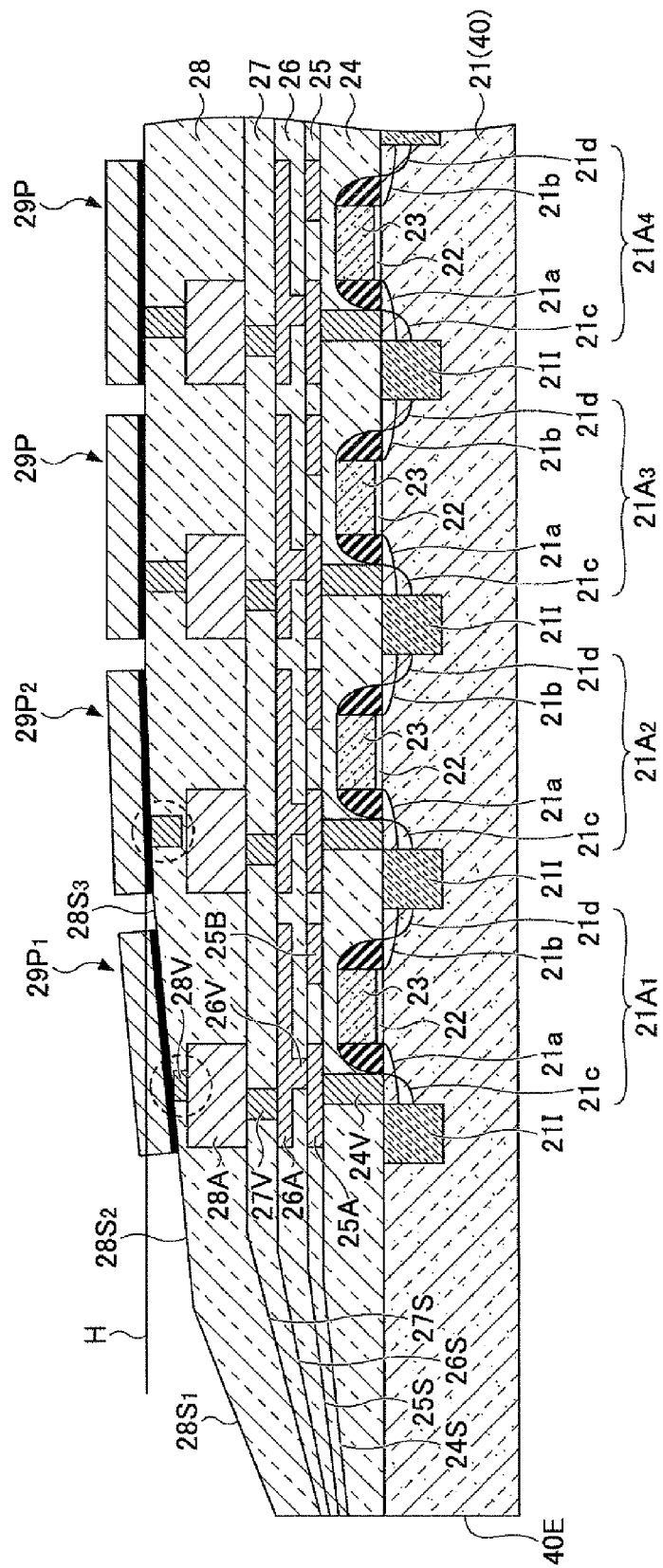
FIG. 5 is a cross-sectional diagram representing a semiconductor device according to a comparative example.

FIG. 5 is a cross-sectional diagram of a semiconductor device 20T fabricated by a fabrication process according to a comparative example in which the etchback process of FIG. 3K is omitted. For the same of comparison, those parts of FIG. 5 explained before are designated by the same reference numerals and the description thereof will be omitted.

Referring to FIG. 5, the present comparative example applies a first chemical mechanical polishing process to the structure of FIG. 3I for the planarization and a second chemical mechanical polishing process for forming the via-plugs 28V. Because of this, there is formed an inclined surface $28S_1$ having an angle steeper as compared with the angle of the inclined surface 27S in connection with the edge 40E of the wafer 40, wherein inclined surfaces $28S_2$ and $28S_3$ of less steep angles may follow consecutively and continuously in the inner side of the inclined surface $28S_1$ with consecutively reducing inclination angles. Thereby, it should be noted that, contrary to the structure of FIG. 3O, the inclined surfaces $28S_2$ and $28S_3$ extend to and reach the device regions $21A_1$ and $21A_2$, respectively, and the pixel electrodes $29P_1$ and $29P_2$ thus formed on the inclined surfaces $28S_2$ and $28S_3$ are inevitably inclined as compared with other pixel electrodes 29P. Thus, with the semiconductor device according to the comparative example of FIG. 5, the incident lights are reflected by the pixel electrodes $29P_1$ and $29P_2$ in the directions offset from the desired direction.

Further, with the comparative example of FIG. 5, it will be noted that the via-plugs 28V marked up by the broken lines are formed on the inclined surface $28S_2$ or $28S_3$ and thus at the levels lower than a horizontal line H, which is an extension of the planarized surface $28f$ of the interlayer insulation film 28. Because of this, there arises a problem that sufficient exposure dose is not attained at the time of lithography for forming the via-plugs 28V and the formation of the corresponding via-holes tend to become incomplete. Thus, the semiconductor device of the comparative example tends to suffer from low yield of production.

The semiconductor device 20S of the present embodiment may be formed as discrete semiconductor chips by dicing the silicon wafer 40, after formation on the silicon wafer 40, along the scribe lines 40L represented in FIG. 2. Alternatively, the semiconductor device 20S may also be sold or used while in the form of the silicon wafer 40.

[Second Embodiment]

Figure 6A:
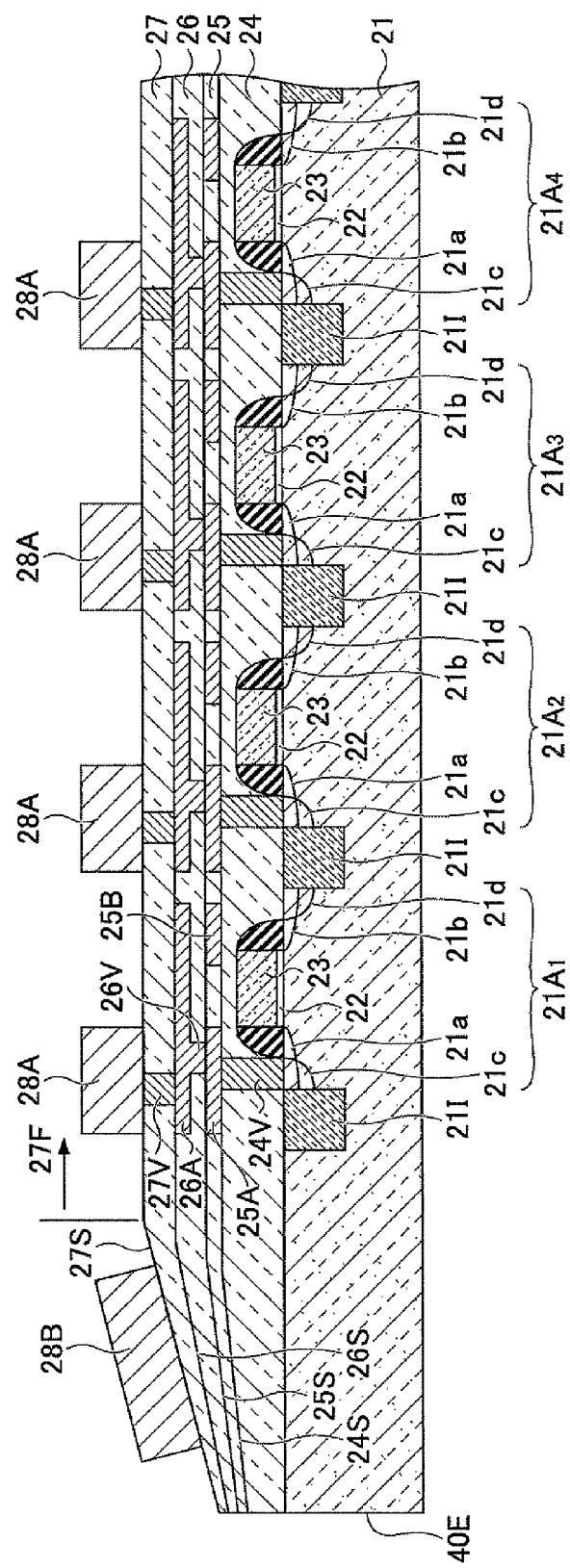
FIGS. 6A-6C are cross-sectional process flow diagrams representing the process of fabricating the semiconductor device according to a second embodiment.
Figure 6B:
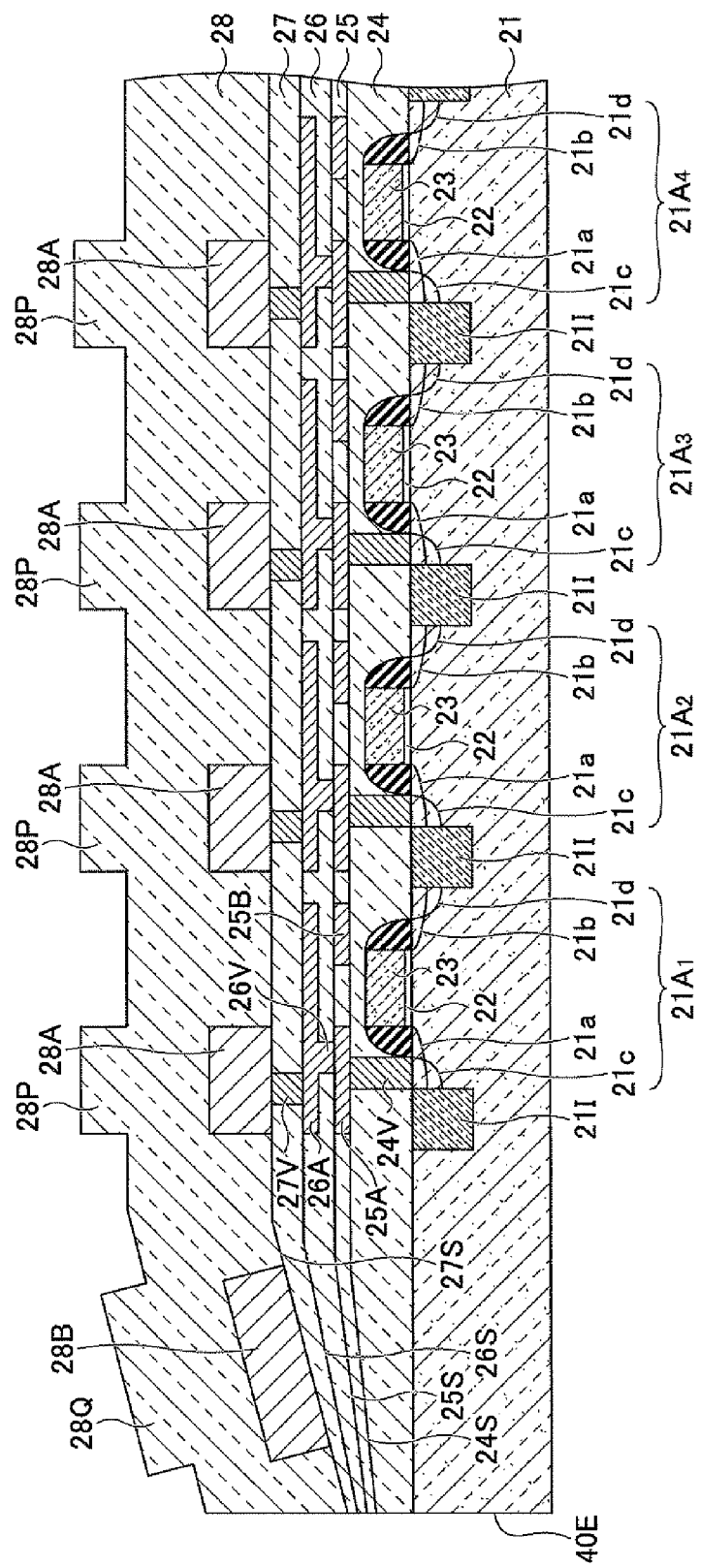
Figure 6C:
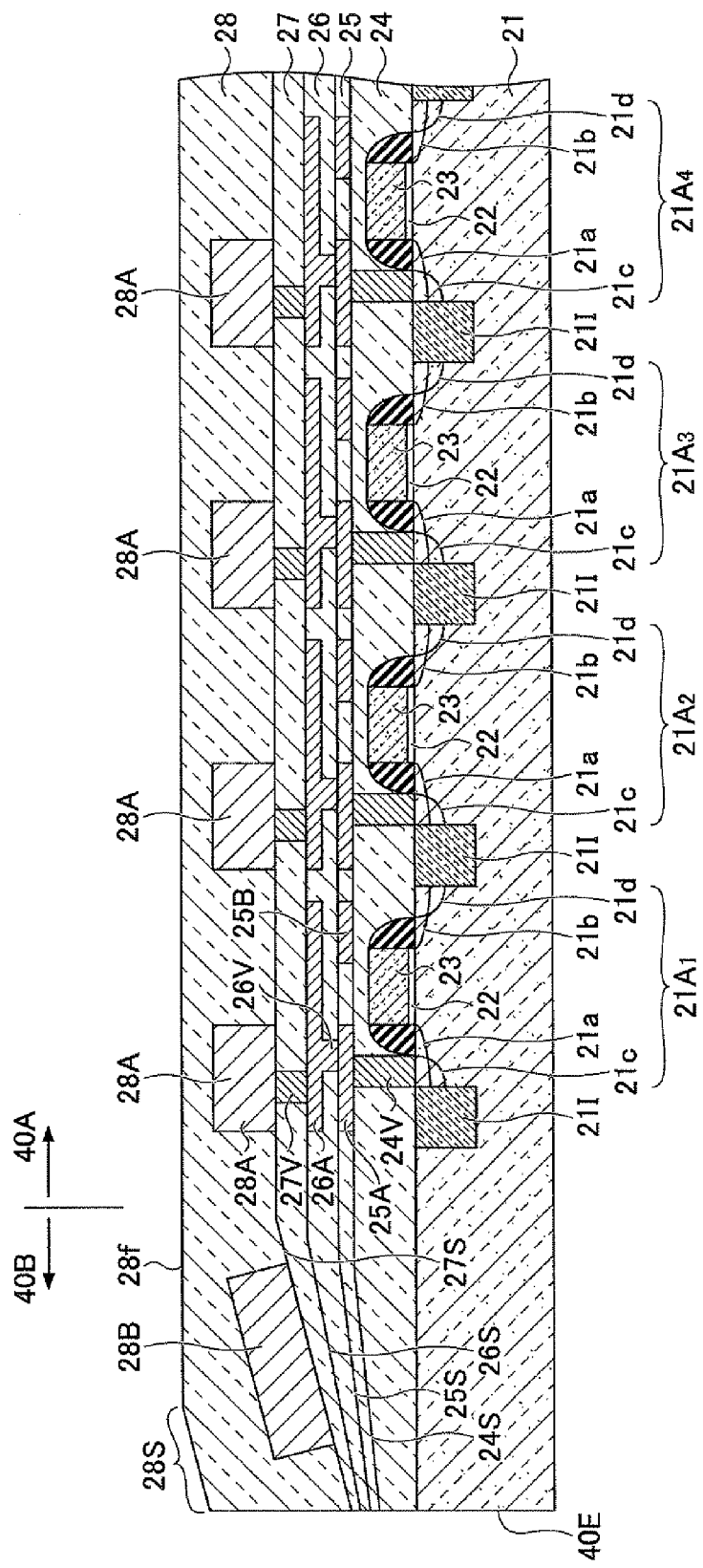

FIGS. 6A-6C are cross-sectional process flow diagrams representing the fabrication process of a semiconductor device according to a second embodiment, which is implemented subsequent to the step of FIG. 3G.

Referring to FIG. 6A, the present embodiment not only forms the connection pads 28A on the flat region 27F of the interlayer insulation film 27 by patterning the Al film 28M of the structure of FIG. 3G but forms an Al pad 28B also on the inclined surface 27S with the same thickness.

Next, in the step of FIG. 6B, the interlayer insulation film 28 is deposited upon the interlayer insulation film 27 in conformity with the shape of the underlying layer by a CVD process, for example, so as to bury the connection pads 28A and further the Al pad 28B. As a result, not only the projections 28P are formed in the interlayer insulation film 28 in a part corresponding to the flat region 27F of the underlying interlayer insulation film 27 in correspondence to the connection pads 28A but there is also formed a projection 28Q in the part covering the inclined surface 27S of the interlayer insulation film 27 in correspondence to the Al pad 28B.

Thus, when the interlayer insulation film of FIG. 6B is planarized by a chemical mechanical polishing process in the next step of FIG. 6C, the increase of the polishing rate in the outer region 40B is canceled out more or less by the increase of the polishing time for polishing the projection 28Q. Note that the projection 28Q is formed in the interlayer insulation film 28 in correspondence to the outer region 40B in the vicinity of the wafer edge 40E. Thus, a structure represented in FIG. 6C is obtained such that the planarized surface 28f of the interlayer insulation film has expanded to the outer region 40B.

By forming the pixel electrode 29P having such a planarized principal surface similarly to the process of FIGS. 3N and 3O, it becomes possible to form the desired semiconductor device with high yield.

In the present embodiment, the Al pad 28B is formed on the inclined surface 28S of the interlayer insulation film 28. Even so, there arises no problem of incomplete pattern formation as the Al pad 28B has a much larger size as compared with minute via-plugs and thus can be exposed with a low-resolution optical system having much larger focal depth.

It should be noted that the Al pad 28B may also constitute a part of the wiring layer of the Al connection pads 28A.

It should be noted that, in those chips having a part extending into the outer region 40B as represented in FIG. 2 by a broken line, there may be a possibility that the Al pad 28B remains at one of the four corners.

[Third Embodiment]

Figure 7A:
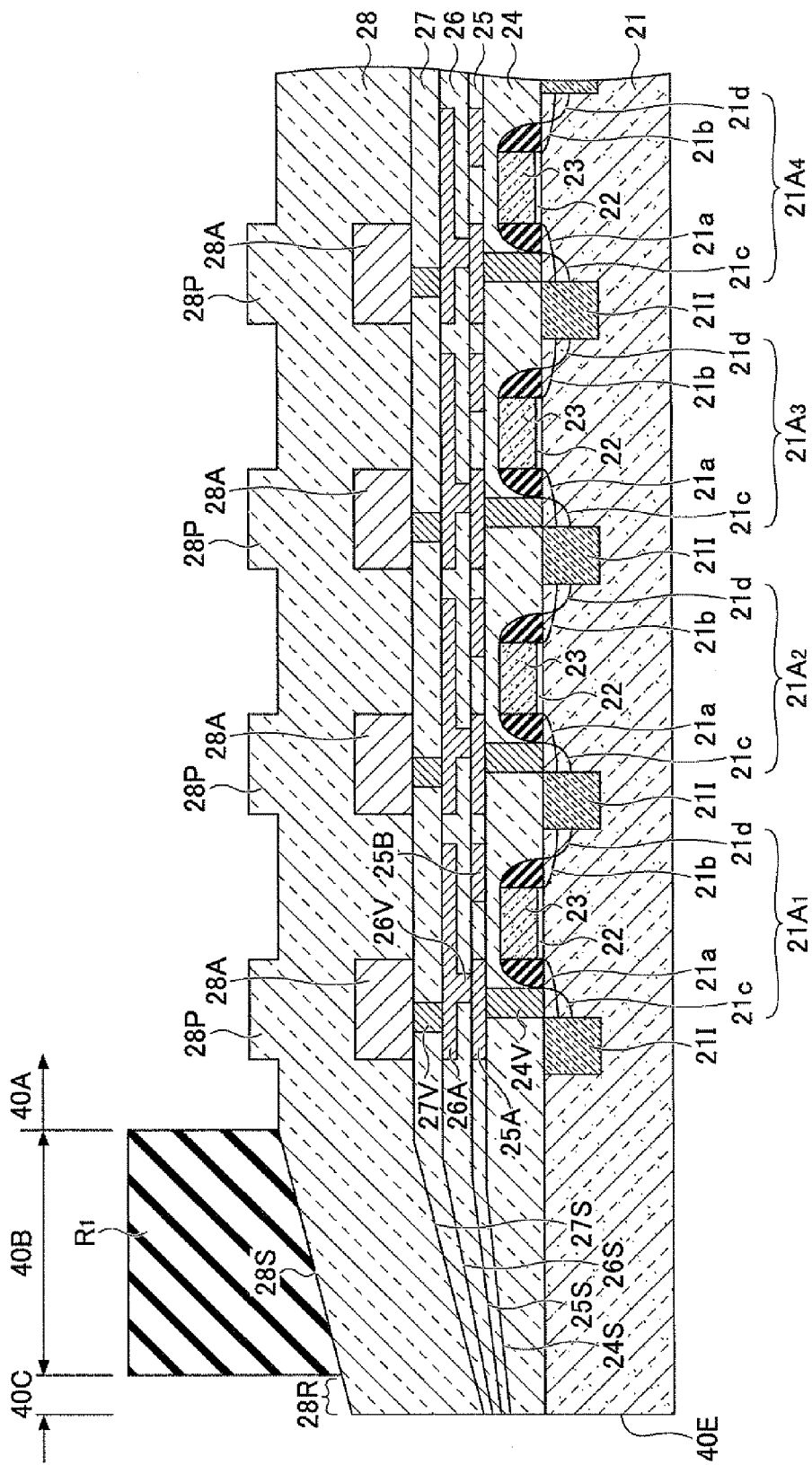
FIGS. 7A-7C are cross-sectional process flow diagrams representing the process of fabricating the semiconductor device according to a third embodiment.
Figure 7B:
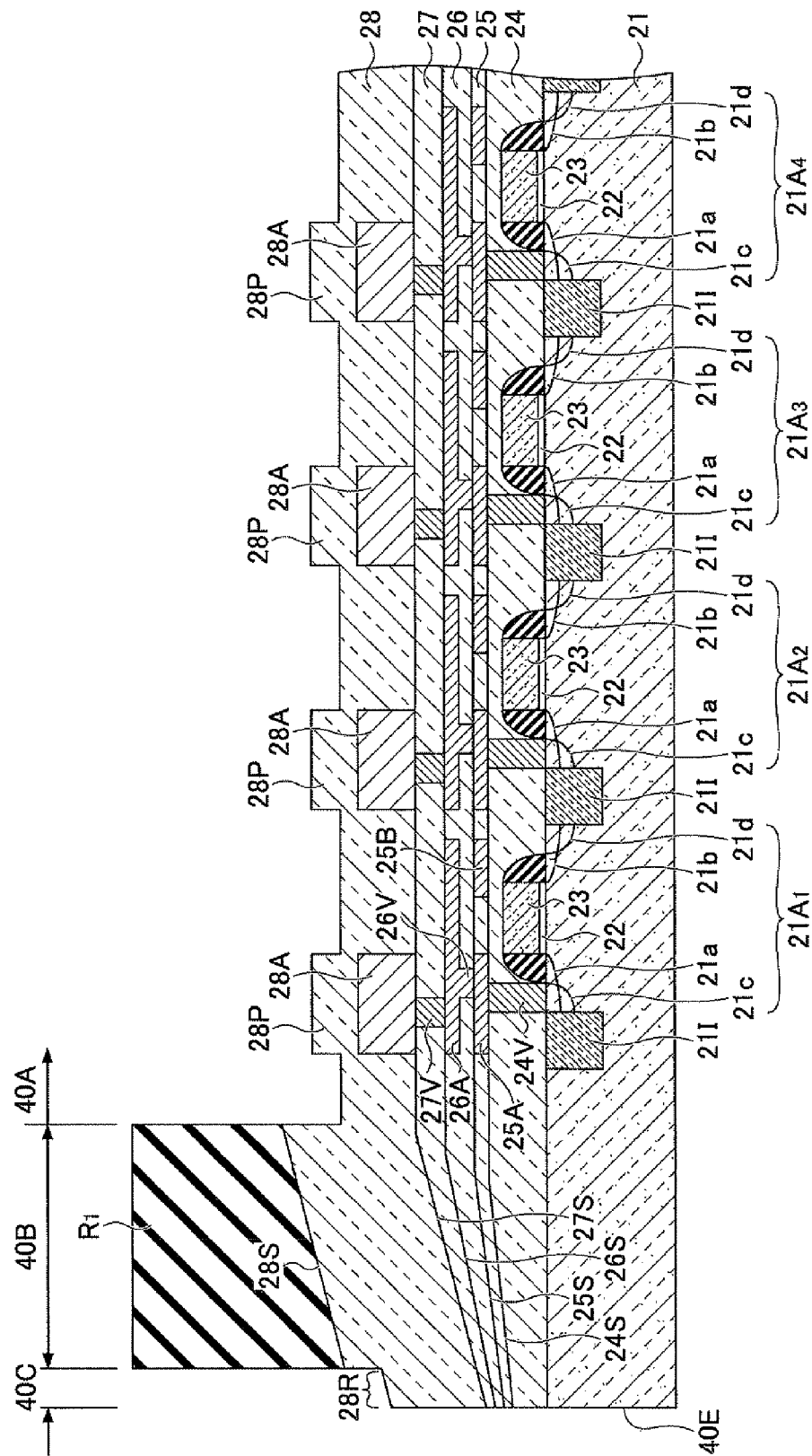
Figure 7C:
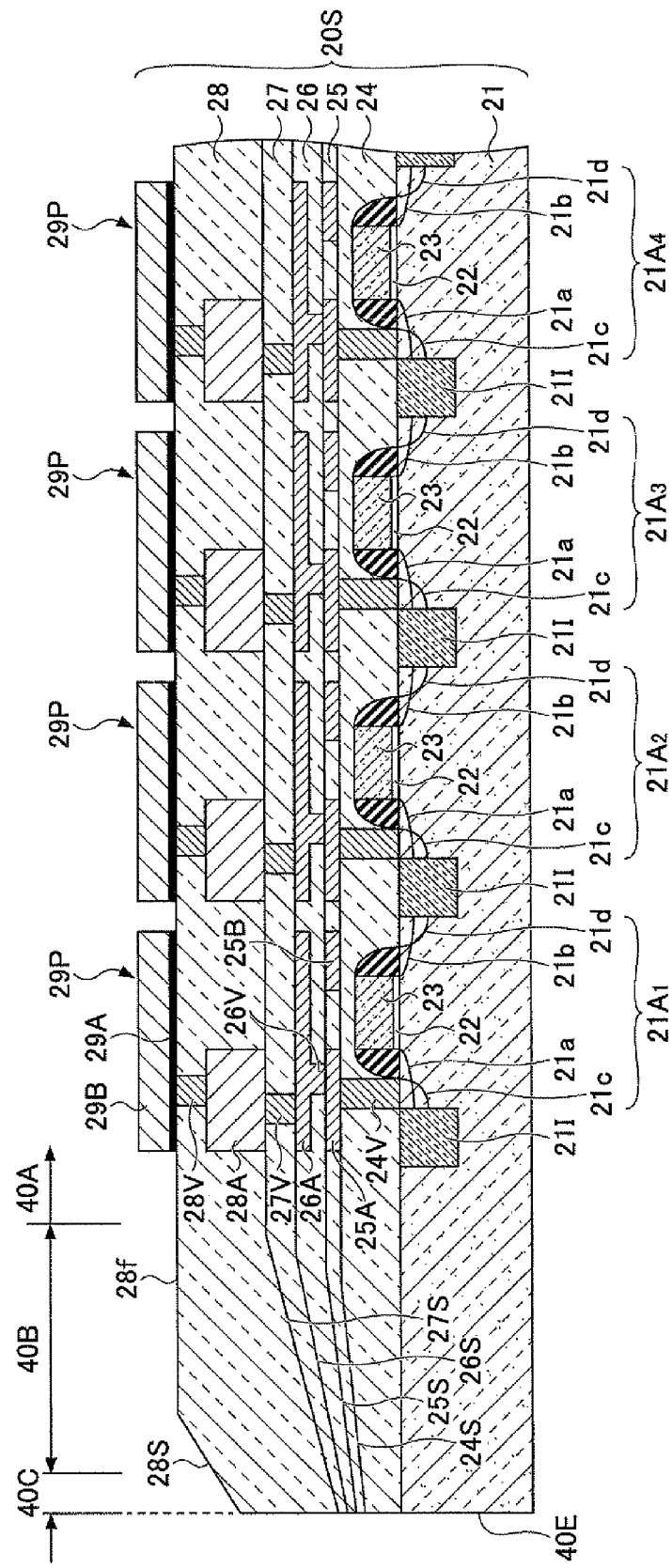

FIGS. 7A-7C are cross-sectional process flow diagrams representing a part of the fabrication process of a semiconductor device according to a third embodiment, which is implemented subsequent to the step of FIG. 3I.

Referring to FIG. 7A, the present embodiment applies an optical beam 2 in the exposure step of FIG. 4 in such a manner that there occurs no exposure in a band-like region 28R formed in a part of the inclined surface 28S adjacent to the wafer edge 40E with a width of 0 mm-1 mm, for avoiding peeling of the resist film when forming the resist pattern $R_1$ in the step of FIG. 3J. Here, it should be noted that the width of 0 mm of the band-like region 28R means that the outer edge of the resist film is in coincident with the wafer edge 40E. In such a case, the resist film extending beyond the wafer edge 40E is removed. As a result, the resist pattern $R_1$ is formed, in the present embodiment, at an inner side with regard to the band-like region 28R in a manner to avoid the band-like region 28R as represented in FIG. 7A.

Figure 8A:
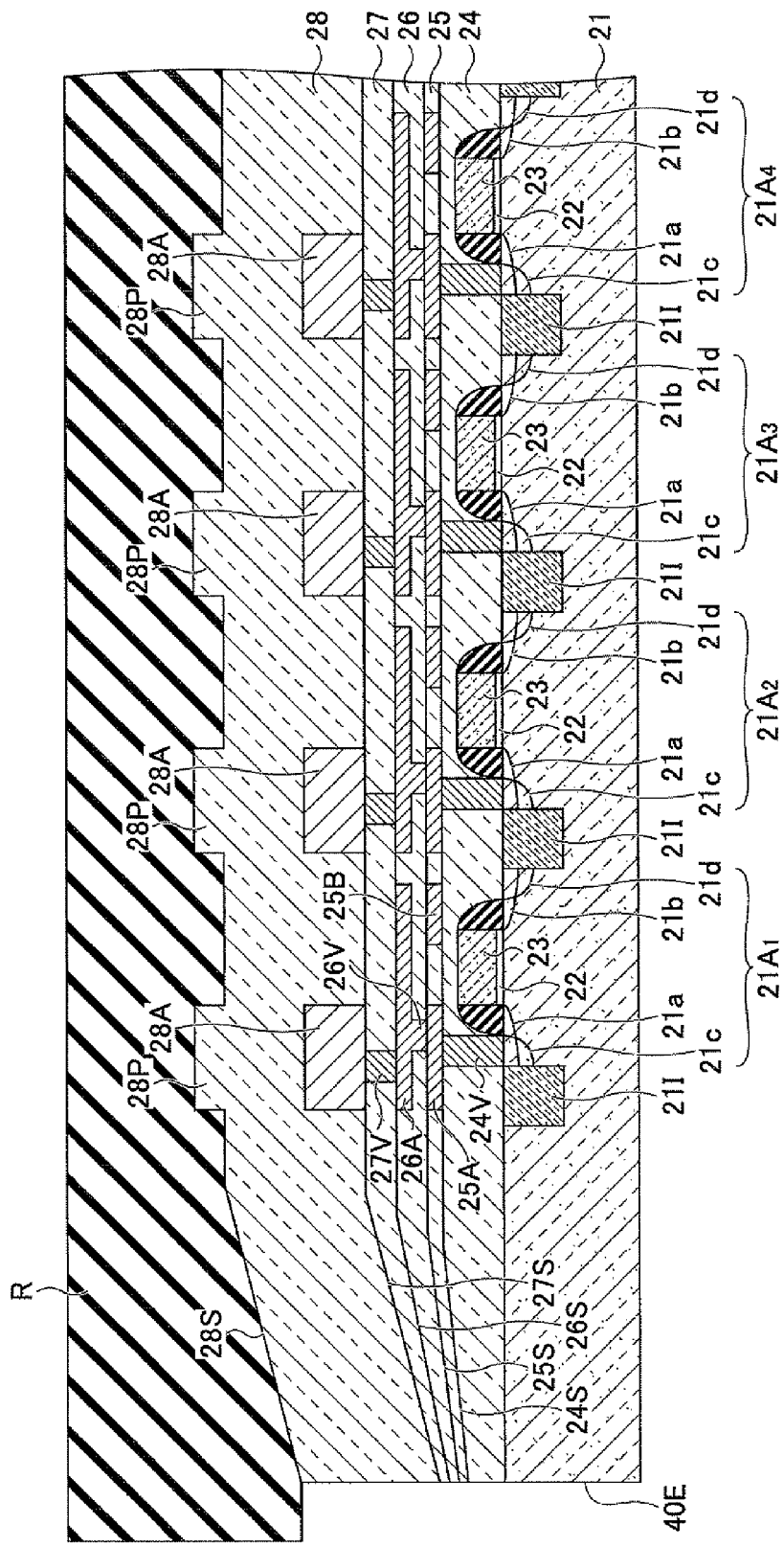
FIGS. 8A and 8B are cross-sectional process flow diagrams representing the process of fabricating a semiconductor device according to a modification of the third embodiment.

In the case the resist film R coated upon the interlayer insulation film 28 is formed to extend beyond the wafer edge 40E as in the example of FIG. 8A, there is a tendency that the resist film R peels off easily. Contrary to the foregoing, the resist pattern $R_1$ of FIG. 7A is obtained by irradiating the optical beam 2 such that there occurs no exposure in the band-like region of a width of 1 mm, for example, formed adjacent to the wafer edge 40E at the time of forming the resist pattern $R_1$ by patterning of the resist film R.

Figure 8B:
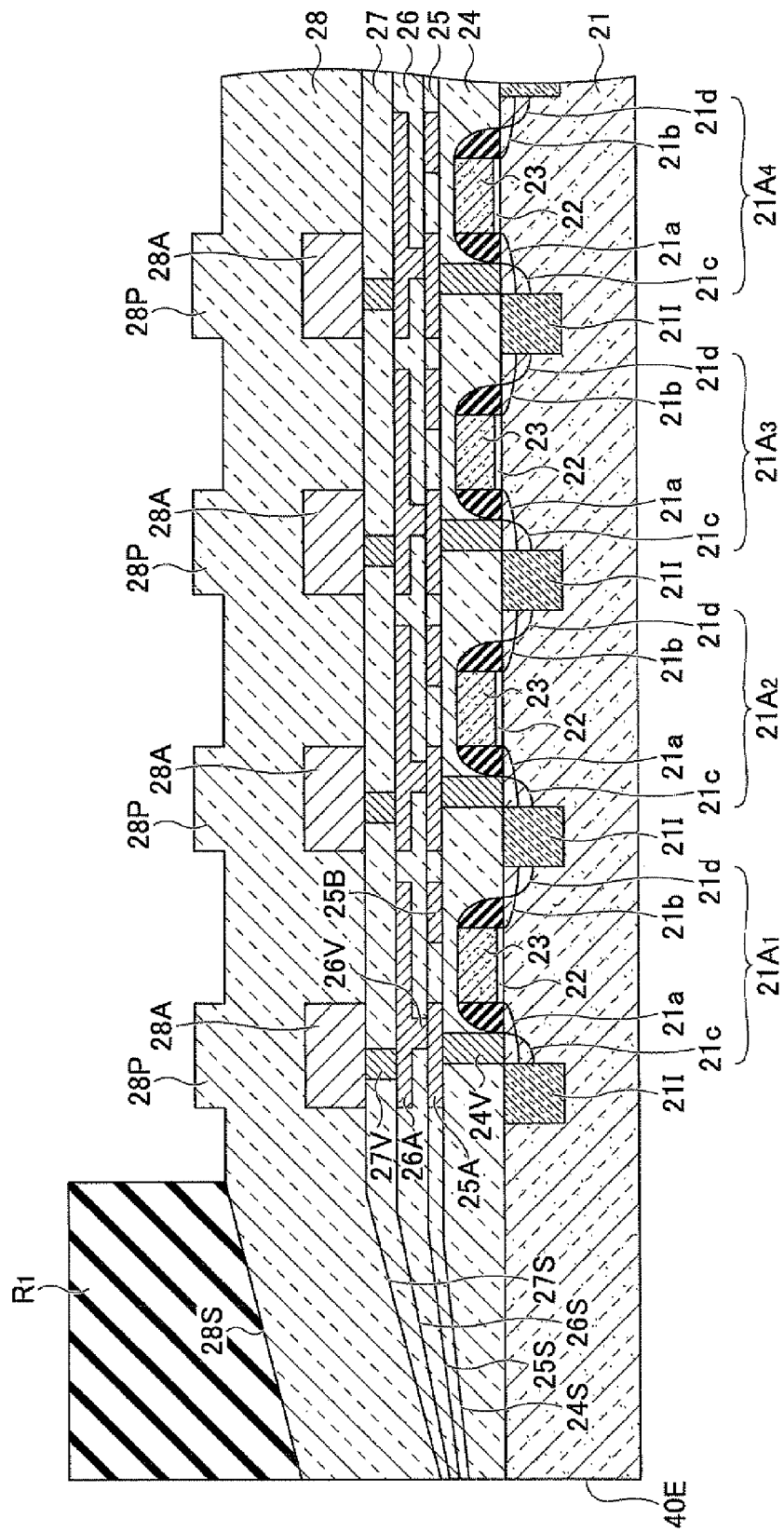

As represented in FIG. 8B, there may be obtained a structure in which the band-like region has the width of 0 mm in the case only the part of the resist film R that has extended out from the wafer edge 40E is removed by exposure and development.

In the present embodiment, it should be noted that, while the inner region 40A of the silicon wafer 40 is defined as corresponding to the inner region of the inclined surface 27S similarly to the previous embodiments, the outer region 40B is defined as being located at the inner side of an outermost peripheral region 40C that corresponds to the band-like region 28R. Thus, in the present embodiment, the outermost peripheral region 40C is formed at the outer side of the outer region 40B as represented in FIG. 7A.

The structure represented in FIG. 7B is obtained by etching back the structure of FIG. 7A by an anisotropic etching process working generally perpendicular to the principal surface of the silicon substrate 21.

In the example of FIG. 8B, too, the part of the resist pattern $R_1$ corresponding to the inner region 40A is removed similarly to the first embodiment.

Further, by planarizing the interlayer insulation film 28 by chemical mechanical polishing after removing the resist pattern $R_1$ in the structure of FIG. 7B, the semiconductor device 20S represented in FIG. 7C is obtained similarly to the case of FIG. 3O by forming the pixel electrode 29P on the planarized surface 28f of the interlayer insulation film 28.

Because the resist pattern $R_1$ is not formed adjacent to the wafer edge 40E in the present embodiment, peeling off of the resist pattern $R_1$ occurs less easily and the production yield of the semiconductor device 20S is improved.

While explanation has been made heretofore with regard to a semiconductor device used with the reflection-type liquid crystal display device 20 of FIG. 1, the various embodiments are useful for improving the production yield in general semiconductor devices having a multilayer wiring structure formed by damascene process or dual damascene process.

In the structure of FIG. 3O or FIG. 7C, it should be noted that the pixel electrode 29P is formed on the planarized surface 28f of the interlayer insulation film 28. Thus, it becomes possible to attain secure via-connection also in the case of forming a general electrode of Al or Au in place of the pixel electrode 29P and forming a next interlayer insulation film and a next wiring layer thereon as compared with the comparative example of FIG. 5. With this, it becomes possible to improve the yield of production of the semiconductor device as compared with the case of comparative example of FIG. 5.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of fabricating a semiconductor device comprising:
    forming a first insulation film over a semiconductor substrate, said semiconductor substrate including an outer region and an inner region located at an inner side of said outer region;
    forming a first wiring over said first insulation film in said inner region;
    forming a second insulation film over said first wiring and over said first insulation film;
    decreasing a film thickness of said second insulation film in said inner region with regard to a film thickness of said second insulation film in said outer region; and
    planarizing said second insulation film after said decreasing said film thickness of said second insulation film.

2. The method as claimed in claim 1, wherein there is formed another wiring in said first insulation film by a damascene process in electrical connection with said first wiring.

3. The method as claimed in claim 1, wherein said decreasing said film thickness of said second insulation film includes:
  forming a mask over said second insulation film in said outer region;
  removing a part of said second insulation film in said inner region while using said mask as an etching mask; and
  removing said mask after said removing said part of said second insulation film.

4. The method as claimed in claim 3, wherein
  said semiconductor substrate includes an outermost peripheral region at an outer side of said outer region to reach an edge of said semiconductor substrate, and wherein
  forming said mask includes:
  forming a resist film over said second insulation film; and
  removing said resist film from said inner region and from said outermost peripheral region.

5. The method as claimed in claim 1, wherein said decreasing said film thickness is conducted such that said first wiring is not exposed from said second insulation film.

6. The method as claimed in claim 5, wherein said second insulation film is formed with a film thickness exceeding 1.5 times a height of said first wiring, and said step of decreasing said film thickness decreases said film thickness of said second insulation film at least by 10%.

7. The method as claimed in claim 1, wherein a film thickness of said first insulation film in said outer region is thinner than a film thickness of said first insulation film in said inner region.

8. The method as claimed in claim 7, further including, before forming said first wiring:
  forming an opening exposing a lower wiring in said first insulation film;
  forming a conductive material of said lower wiring in said opening that exposes said lower wiring; and
  polishing said first insulation film and said conductive material of said lower wiring to form said lower wiring.

9. The method as claimed in claim 1, further including:
  forming a conductive plug that is connected to said first wiring in said second insulation film after planarizing said second insulation film; and
  forming an optical reflection layer over said second insulation film and said conductive plug.

10. The method as claimed in claim 9, further comprising forming a liquid crystal layer over said optical reflection layer,
  wherein a liquid crystal display device includes said semiconductor substrate, said first insulation film, said first wiring, said second insulation film, said conductive plug, said optical reflection layer and said liquid crystal layer.

11. A method of fabricating a semiconductor device comprising:
  forming a first insulation film over a semiconductor substrate that includes an outer region and an inner region located at an inner side of said outer region;
  forming a first wiring over said first insulation film in said outer region and in said inner region;
  forming a second insulation film over said first wiring and over said first insulation film; and
  polishing said second insulation film.

12. A semiconductor device, comprising:
  a semiconductor substrate that includes an outer region and an inner region located at an inner side of said outer region;
  a first insulation film formed over said semiconductor substrate;
  a lower wiring formed in said first insulation film in said inner region;
  a first wiring formed over said first insulation film in said outer region and in said inner region;
  a second insulation film formed over said first wiring;
  a conductive plug formed in said second insulation film in electrical connection with said first wiring; and
  an optical reflection layer formed over said second insulation film and said conductive plug.

13. The semiconductor device as claimed in claim 12, wherein a film thickness of said first insulation film in said outer region is thinner than a film thickness of said first insulation film in said inner region.

* * * * *